United States Patent
Devaney et al.

(10) Patent No.: US 7,272,368 B2
(45) Date of Patent: Sep. 18, 2007

(54) SYSTEM AND METHOD FOR REDUCED DEVIATION TIME DOMAIN FM/PM DISCRIMINATOR TO ACHIEVE A REDUCED BANDWIDTH FREQUENCY OR PHASE MODULATION COMMUNICATIONS CHANNELS

(76) Inventors: Patrick Owen Devaney, 826 Orange Ave., #435, Coronado, CA (US) 92118; Alan Jack Herr, 826 Orange Ave., #435, Coronado, CA (US) 92118

( * ) Notice: Subject to any disclaimer, the term of this patent is extended or adjusted under 35 U.S.C. 154(b) by 596 days.

(21) Appl. No.: 10/264,513

(22) Filed: Oct. 4, 2002

(65) Prior Publication Data
US 2003/0100278 A1    May 29, 2003

Related U.S. Application Data

(60) Provisional application No. 60/327,836, filed on Oct. 6, 2001.

(51) Int. Cl.
H04B 1/16    (2006.01)
H04B 7/00    (2006.01)

(52) U.S. Cl. .................. 455/130; 455/214; 455/263; 455/336; 455/337

(58) Field of Classification Search ............ 455/70–72, 455/205, 215, 314–315, 214, 323, 336, 263, 455/293, 337; 375/324, 325, 340
See application file for complete search history.

(56) References Cited

U.S. PATENT DOCUMENTS

| | | | |
|---|---|---|---|
| 4,238,783 A | 12/1980 | Miller | |
| 4,250,456 A | 2/1981 | Shinmyo et al. | |
| 4,601,048 A | 7/1986 | Ryan | |
| 4,675,881 A | 6/1987 | Chung | |
| 4,876,741 A * | 10/1989 | Jacobs et al. | 455/47 |
| 5,014,317 A * | 5/1991 | Kita et al. | 704/274 |
| 5,375,255 A * | 12/1994 | Baier et al. | 455/72 |
| 5,448,242 A * | 9/1995 | Sharpe et al. | 342/42 |
| 5,745,856 A * | 4/1998 | Dent | 455/552.1 |
| 5,783,967 A | 7/1998 | Takaya | |
| 6,032,048 A * | 2/2000 | Hartless et al. | 455/506 |
| 6,205,184 B1 * | 3/2001 | Al-Eidan | 375/316 |
| 6,327,312 B1 * | 12/2001 | Jovanovich et al. | 375/316 |
| 6,407,629 B1 * | 6/2002 | Burri et al. | 329/347 |
| 6,496,547 B1 * | 12/2002 | Powell et al. | 375/316 |
| 6,967,974 B1 * | 11/2005 | Partyka | 370/527 |

* cited by examiner

*Primary Examiner*—Simon Nguyen
(74) *Attorney, Agent, or Firm*—Polster, Lieder, Woodruff & Lucchesi, LC

(57) ABSTRACT

The present disclosure provides a receiver for receiving a narrow frequency deviation frequency modulated or phase modulated base band signal including a mixer for mixing the received narrow frequency deviation signal to generate an intermediate frequency signal, a band pass filter for filtering the intermediate frequency signal, and a narrow band discriminator circuit that performs a time domain expansion of the modulation deviation of the intermediate frequency signal and discriminates the base band signal.

21 Claims, 27 Drawing Sheets

SYSTEM AND METHOD FOR REDUCED DEVIATION TIME DOMAIN FM/PM DISCRIMINATOR TO ACHIEVE A REDUCED BANDWIDTH FREQUENCY OR PHASE MODULATION COMMUNICATIONS CHANNELS

RELATED APPLICATIONS

This application claims the priority of U.S. Provisional Patent Application Ser. No. 60/327,836 filed Oct. 6, 2001, the contents of which are incorporated herein by reference.

BACKGROUND OF THE INVENTION

1. Field of Invention

The present invention relates to increasing the number of communication channels, or information per fixed frequency bandwidth. In particular, it relates to a systematic method of increasing the number of channels per fixed frequency bandwidth significantly reducing each individual channel's bandwidth by using a reduced bandwidth Frequency Modulation or Phase Modulation signal.

2. Related Art

With each year, the MW, SW, VHF, and UHF bands have become more congested with increased demands from cell phones, personal communications devices, and pagers. However, the available radio frequency bandwidths in the MW, SW, VHF, and UHF bands available to the communications user has not expanded due to regulations and restrictions imposed by governmental and international treaty restrictions. The present day communication bands are essentially filled to capacity using present day modulation techniques and channel spacing. With the growing demands for communications systems, there is increased competition for already crowded radio frequency bands.

In the past, manufacturers have moved to higher frequencies to find additional or available communications channel bandwidth. Further, in most industrialized countries, all of the economically viable radio frequencies are committed to specified communications channels and their corresponding spacing. Seeking higher frequencies also poses significant health problems that are known to exist at higher frequencies from radiated radio frequency energy.

The only solution to the congested communications radio spectrum is to increase the number of communication channels in each allotted radio frequency band. The obvious methodology is to use communications channel bandwidth compression techniques. One problem with many of the communication systems that uses narrower bandwidths are a sacrifice of sound qualities and increased bit error rates in data channels. Many of the remaining communication channel compression schemes require complex and expensive electronic implementation.

Thus, there is a need for communication channel bandwidth reduction techniques to allow information to be transmitted over communication channels with reduced bandwidth, while retaining relatively high sound quality and lower bit error rate in data channels.

SUMMARY OF THE INVENTION

The present invention provides for a more efficient utilization of the frequency spectrum, overcoming problems presented by the growing need for more communication channels in today's rapidly expanding communications market. The present invention overcomes the existing technical problems inherent in the present art, in today's current designs, and the techniques used in today's implementation of low frequency deviation modulation communication systems.

The present invention allows the use of bandwidth-reduced communication channels by providing a practical, economically efficient, and reproducible method of demodulating low deviation FM (Frequency Modulated) or PM (Phase Modulated) signals, while significantly increasing the SNR (Signal-to-Noise Ratio) of the demodulated signal. The reduced bandwidth reduces the noise power in the communications channel while maintaining the same signal power, thus the SNR (Signal-to-Noise Ratio) of the communications channel is improved. The increased SNR produces signals with increased clarity, significantly decreased BER (Bit Error Rate), and allows higher data rates while allowing the carrier channel spacing to be reduced. In particular, the invention's purpose is to use low deviation FM and PM communications channels (low deviation FM and PM RF transmitters) which occupy significantly less bandwidth compared to present art, thus allowing the use of more closely spaced communication channels. Furthermore, it allows an increase in the number of communication channels in a particular band segment while increasing SNR of the communication channel.

In accordance with the present invention, a low deviation FM (Frequency Modulated) or PM (Phase Modulated) communications channel can be implemented, transmitting the signal in a reduced carrier frequency bandwidth; receiving the signal; mixing the received signal to an IF (Intermediate Frequency); and then detecting the low deviation FM or PM signal using a reduced deviation time domain fm/pm discriminator. The low deviation FM or PM signal is detected by logically subtracting the deviation of the IF signal frequency from the long-term average of the IF signal frequency, or an IF reference signal frequency oscillator. The reduced deviation time domain FM/PM discriminator simultaneously demodulates and digitizes low deviation signals to obtain the desired base band audio, video, or data information.

BRIEF DESCRIPTION OF THE DRAWINGS

The nature, advantages, and various features of the invention present itself more completely upon consideration of illustrative embodiments herewith, and described in graphic detail by the accompanying drawings.

In the drawings: present invention.

DETAILED DESCRIPTION OF THE PREFERRED EMBODIMENTS

Figure 1:
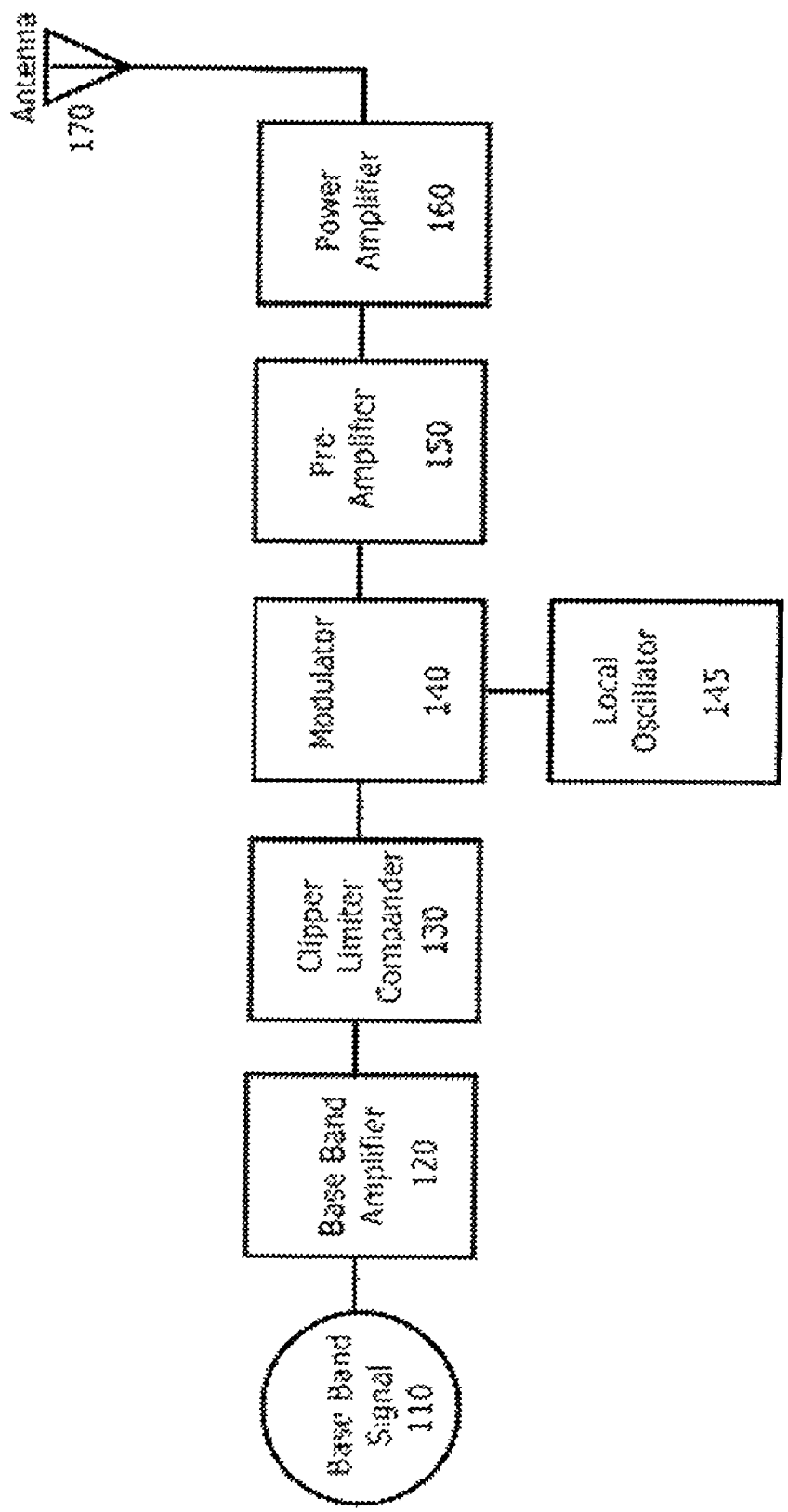
FIG. 1: Shows the block diagram of a preferred embodiment of a low frequency deviation FM or PM transmitter constructed in accordance with the present invention.

The present invention is not intended to be limited to the specific terminology used to demonstrate the methodology of the present invention. It is to be understood that each specific element includes all technical equivalents, which operate in a similar manner to accomplish a similar purpose. For the preferred embodiments describing the present invention illustrated in the drawings, specific terminology is employed for the sake of clarity. A FM (Frequency Modulation) system is described in detail by way of example, although it is understood that the corresponding Phase Modulator components can be substituted for Frequency Modulation components to form an equivalent Phase Modulation (PM) system. Also, minor supporting functional elements (power supplies. etc) well understood by those skilled in the art may be purposely omitted from the following discussion. The frequency multipliers are shown implemented using Phase Lock Loop circuits, but any frequency multiplier circuit is appropriate to implement this patent.

In an FM transmitter, there are two physical phenomena that directly affect the frequency deviation of the transmitted radio frequency signal. The initial frequency deviation occurs in the frequency, or phase, modulator of the transmitter. In the frequency modulator, or phase modulator, the carrier frequency fluctuates, or deviates, or moves from its center frequency or carrier frequency by a delta frequency proportional to the amplitude (voltage) of the base band modulating signal. Additional frequency deviation occurs in the frequency multiplier/divider stages of the transmitter. The frequency deviation of the FM signal is multiplied/divided by the same ratio as the frequency multiplier/divider amplifier stages of the transmitter amplifier string. Thus, the cumulative effects of frequency deviation using a frequency modulator, or phase modulator, and succeeding multiplier/divider stages, allows a means for practically obtaining any desired numeric value for the FM carrier's center frequency and the FM carrier's corresponding frequency deviation in a FM transmitter.

It is well known for those skilled in the art, that merely decreasing, or narrowing, the deviation of an FM (or PM) signal at the transmitter results in significant SNR (Signal-to-Noise Ratio) increases until the modulation index reaches 0 deviation (the transmitted power remains the same, with the noise power decreasing as the bandwidth decreases). The limitations to obtaining the benefits of low frequency deviation signals has been an economic, or practical, method of receiving the reduced deviation FM or PM signal, and demodulating it without significant loss of the transmitted signal's sound quality.

Using prior technology to implement the FM receiver discriminator stage, the frequency deviation, at the conventional discriminator, of the signal's carrier frequency directly controls the quality of the sound output. As the frequency deviation of the FM, or PM, signal is increased (or the signal bandwidth increases) at the transmitter, the SNR (Signal-to-Noise Ratio) of the base band signal (i.e. music, data, voice, etc.) from the conventional frequency discriminator increases, and the resulting base band signal will have increased quality.

Conversely, when the frequency deviation, or bandwidth, of an FM signal is reduced at the transmitter and using conventional frequency discriminators, the SNR (Signal-to-Noise Ratio) decreases, and the BER (Bit Error Rate) increases at the receiver's base band signal output. Thus, any attempt to reduce the individual FM signal bandwidth to allow more signals per fixed frequency bandwidth results in degraded base band signals at the receiver. The audio signal degrades in quality, and the error rate in digital signals dramatically increases. Thus, decreasing the frequency deviation at the transmitter is not viable using conventional FM discriminators and PM demodulators in the receiver.

The present invention allows FM transmitters and receivers, in which the frequency, or phase, modulation of the signal to be transmitted is generated at the transmitting side of a communication channel with a significantly reduced channel bandwidth, or very small corresponding frequency deviation. The frequency modulated signal is transmitted over the communication channel and received at the receiving side of the communication channel. The received signal is mixed with a local oscillator frequency to move the FM signal to the narrow band intermediate frequency. The frequency modulated IF (Intermediate Frequency) signal is applied to the reduced deviation time domain FM/PM discriminator circuit, which produces a digital representation of the FM signal. The advantage of the reduced deviation time domain FM/PM discriminator circuit is the FM signal remains centered at the IF frequency, eliminating the problems associated with frequency multiplication and frequency stability associated with current reduced deviation FM discriminators. The frequency deviation time domain expansion, at the receiving side of the communication channel, is preferably accomplished by utilizing the reduced deviation time domain FM/PM discriminator circuit. Accordingly, the digital representation of the reduced deviation frequency modulated signal produced by the reduced deviation time domain FM/PM discriminator circuit can be further processed digitally in any desired manner to obtain the transmitted base band signal without the quantizing error associated with digitizing the demodulated signal from convention FM discriminators. Thus, the reduced bandwidth, or reduced frequency deviation, FM receiver can reproduce high quality base band audio signals, or digital data signals, with low BER (Bit Error Rate) over a bandwidth limited communications channel.

Referring to the drawings, the invention is described with reference to complete non-limiting illustrative embodiments as follows:

FIG. 1 is a block diagram of a preferred embodiment of an FM (Frequency Modulated) transmitter. After its base band input stage (FIG. 1-110) (e.g. a Microphone, Digital Data, etc.), the FM or PM transmitter includes: a base band amplifier (FIG. 1-120) followed by a limiter/clipper/compander (FIG. 1-130); succeeded by a modulator stage (FIG. 1-140) (i.e. an FM modulator) with its associated carrier, or local, oscillator (FIG. 1-145). Finally, the completed modulator stage (FIG. 1-140) signal output drives a pre-amplifier (FIG. 1-150), followed by a power amplifier (FIG. 1-160), which then drives a suitable antenna (FIG. 1-170), or other communication channel interface (i.e. fiber optic cable).

In accordance with the present invention, the frequency deviation of the transmitted FM signal is limited (i.e. narrowed or reduced), to produce a small carrier frequency deviation resulting in a very narrow channel frequency bandwidth for the output, or transmitting, signal of the FM transmitter or PM transmitter.

Figure 2:
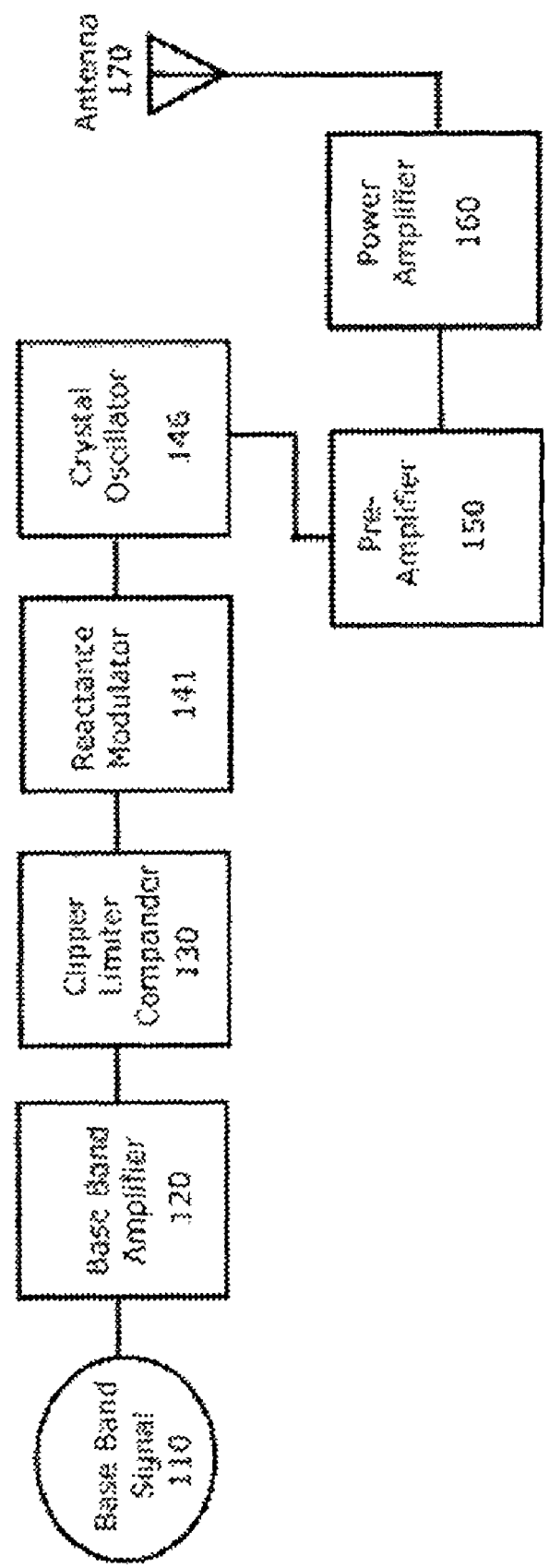
FIG. 2: Shows the block diagram of an alternative embodiment of a low frequency deviation FM or PM transmitter constructed in accordance with the present invention.

FIG. 2 shows a block diagram of an alternative embodiment of the FM transmitter. By way of example, a frequency modulation transmitter (i.e. FM transmitter) is described herein. Most elements in this embodiment are direct equivalents to those described in the preferred embodiment of the FM transmitter shown in FIG. 1, and are not repetitively described. In FIG. 2, the FM carrier modulator is implemented using a controlled reactance modulator (FIG. 2-141), in association with a piezoelectric crystal, or LC, oscillator (FIG. 2-146).

Figure 3:
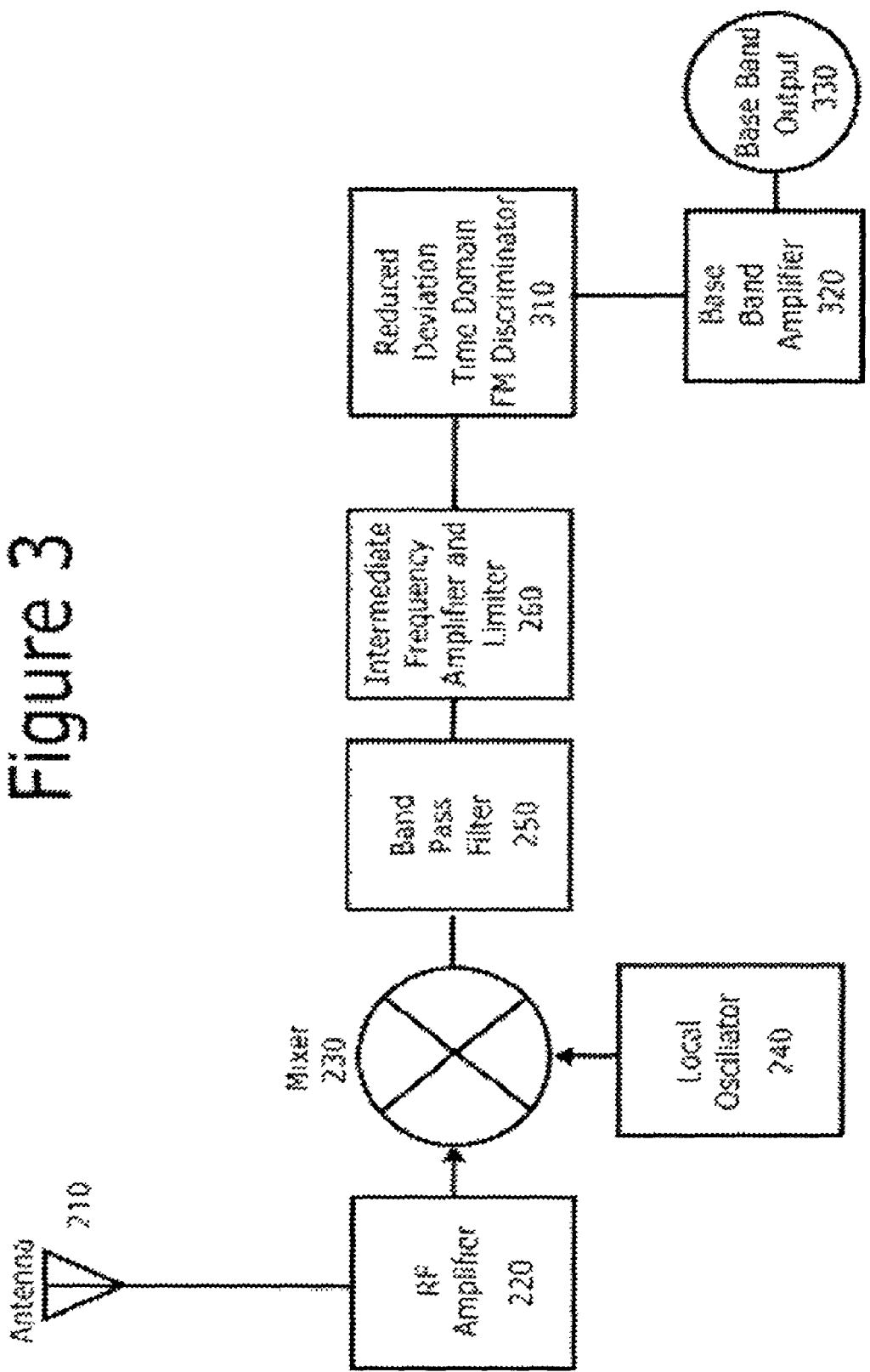
FIG. 3: Shows the block diagram of a preferred embodiment of a single conversion, low frequency deviation, FM or PM receiver constructed in accordance with the present invention.

FIG. 3 shows a block diagram of a preferred embodiment of the FM receiver for receiving the narrow frequency deviation FM signals transmitted from the FM transmitter according to FIGS. 1 and 2. The receiver includes a suitable antenna (FIG. 3-210), or other communication channel interface (i.e. fiber optic cable); followed by an RF amplifier (FIG. 3-220); followed by an RF mixer (FIG. 3-230) with its associated local oscillator stage (FIG. 3-240) to down-convert the received FM or PM signal into a suitable IF (Intermediate Frequency) signal frequency. The completed RF mixer stage (FIG. 3-230) is followed by a band pass filter (FIG. 3-250) centered on the IF signal frequency. The band pass filter (FIG. 3-250) removes the unwanted mixer image, and any DC component from the IF (Intermediate Signal) signal. The band pass filter (FIG. 3-250) is succeeded by an IF (Intermediate Frequency) amplifier/limiter (FIG. 3-260). The IF amplifier/limiter eliminates all of the amplitude variations from the IF signal. Subsequently, the IF amplifier/limiter (FIG. 3-260) is followed by the reduced deviation time domain FM/PM discriminator circuit stage (FIG. 3-310), which expands the frequency deviation of the FM signal using time domain techniques. The preferred embodiment of the reduced deviation time domain FM/PM discriminator circuit is described in FIG. 9, and the alternative embodiment is described in FIGS. 8-17. The reduced deviation time domain FM/PM discriminator circuit stage (FIG. 3-310) is followed by a base band amplifier (FIG. 3-320), and subsequently to the desired base band output device (FIG. 3-330) (i.e. conventional audio equipment including a speaker, or conventional digital equipment including a modem to demodulate the digital signal).

Figure 8:
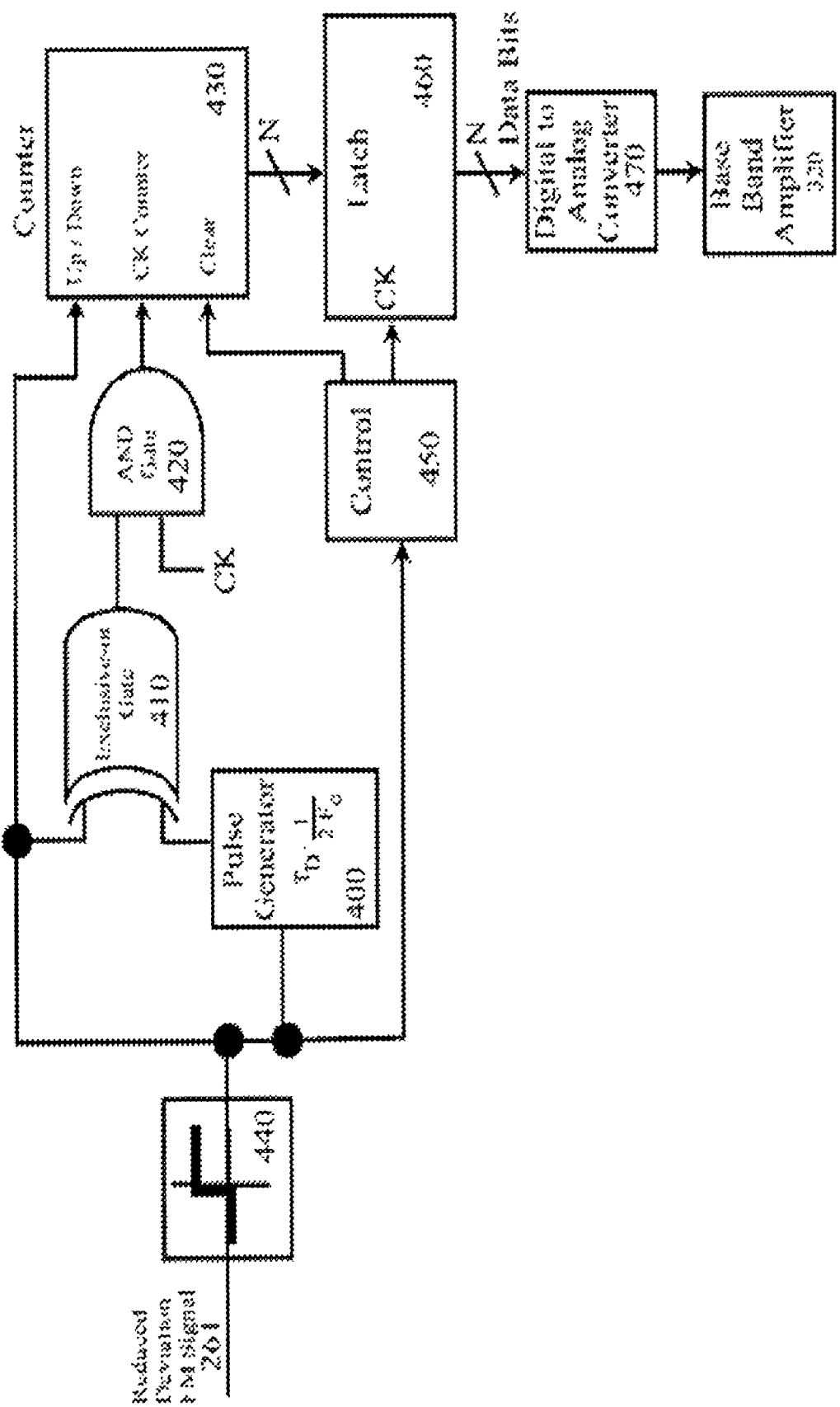
FIG. 8: Shows the block diagram of a preferred embodiment of a low frequency deviation FM or PM reduced deviation time domain FM/PM discriminator circuit constructed in accordance with the present invention.

In accordance with a preferred embodiment of the invention, the receiver includes a reduced deviation time domain FM/PM discriminator circuit that stretches, or multiplies, the apparent frequency deviation of the IF (Intermediate Frequency) low deviation FM signal. The reduced deviation time domain FM/PM discriminator circuit shown in FIG. 8 is a preferred embodiment, and an alternative embodiment of the reduced deviation time domain FM/PM discriminator circuit is shown in FIGS. 9-17.

It is an advantage of a preferred embodiment of the invention that, when the expanded narrow frequency deviation signal is applied to the reduced deviation time domain FM/PM discriminator circuit (FIG. 3-310), the reduced deviation time domain FM/PM discriminator circuit demonstrates significantly improved FM frequency discrimination properties with a better SNR (Signal-to-Noise Ratio) compared with the conventional frequency discrimination of a non-expanded FM signal. Accordingly, the combination of a low deviation FM modulator transmitter (FIG. 1 or 2) with a receiver containing the reduced deviation time domain FM/PM discriminator circuit (i.e. FIG. 3-310) provides a significant advantage over known systems.

Figure 4:
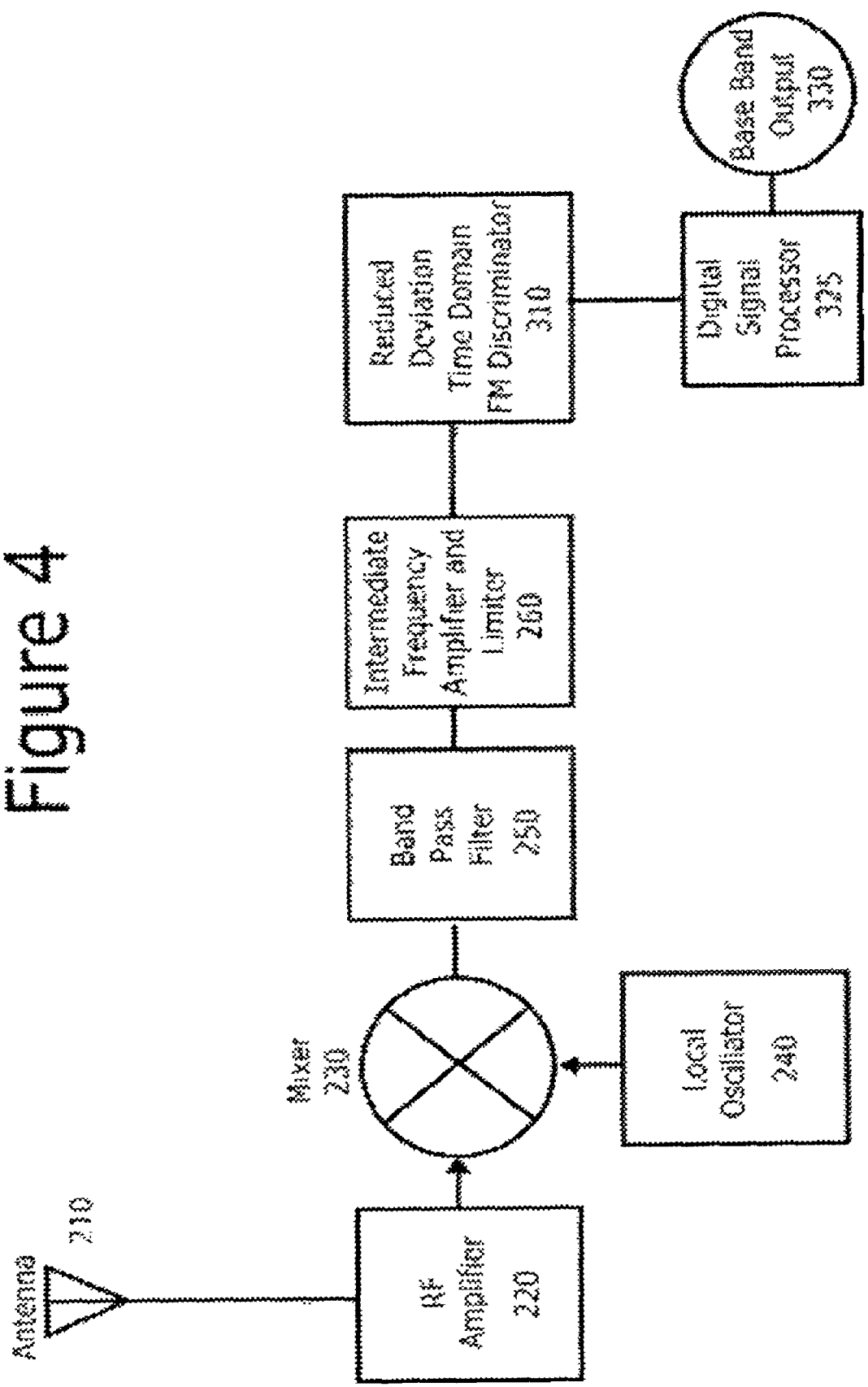
FIG. 4: Shows the block diagram of an alternative embodiment of a single conversion, low frequency deviation, FM or PM receiver of a low frequency deviation, FM or PM receiver constructed in accordance with the present invention.

FIG. 4 shows a block diagram of an alternative embodiment of a single conversion FM receiver for receiving the narrow frequency deviation FM signals transmitted from the FM transmitter according to FIG. 1 or 2. Most elements in this embodiment are direct equivalents to those in the exemplary embodiment of the FM receiver shown in FIG. 3, and are not repetitively described.

The reduced deviation time domain FM/PM discriminator circuit stage (FIG. 3-310) is followed by a DSP base band processor (FIG. 4-325). The DSP base band processor (FIG. 4-325) demodulates the low frequency deviation FM signal using digital filter techniques to obtain the base band information. The block diagram in FIG. 4 exemplifies the major advantage when the low frequency deviation FM receiver constructed in accordance with the present invention. The output of the reduced deviation time domain FM/PM discriminator circuit stage (FIG. 3-310) is in a digital format. There is no information loss in digitizing the analog output base band signals, as in conventional analog methods of detecting FM signals which require digitizing the analog output base band signals, using a low deviation FM receiver constructed in accordance with the present invention because the reduced deviation time domain FM/PM discriminator circuit stage (FIG. 3-310) output is in a digital format. The direct digital output of the base band signals from the reduced deviation time domain FM/PM discriminator circuit stage (FIG. 3-310) represents a significant improvement over existing low deviation receiver techniques where the output of either the IF string must be digitized, or the base band output of the FM discriminator.

Figure 5:
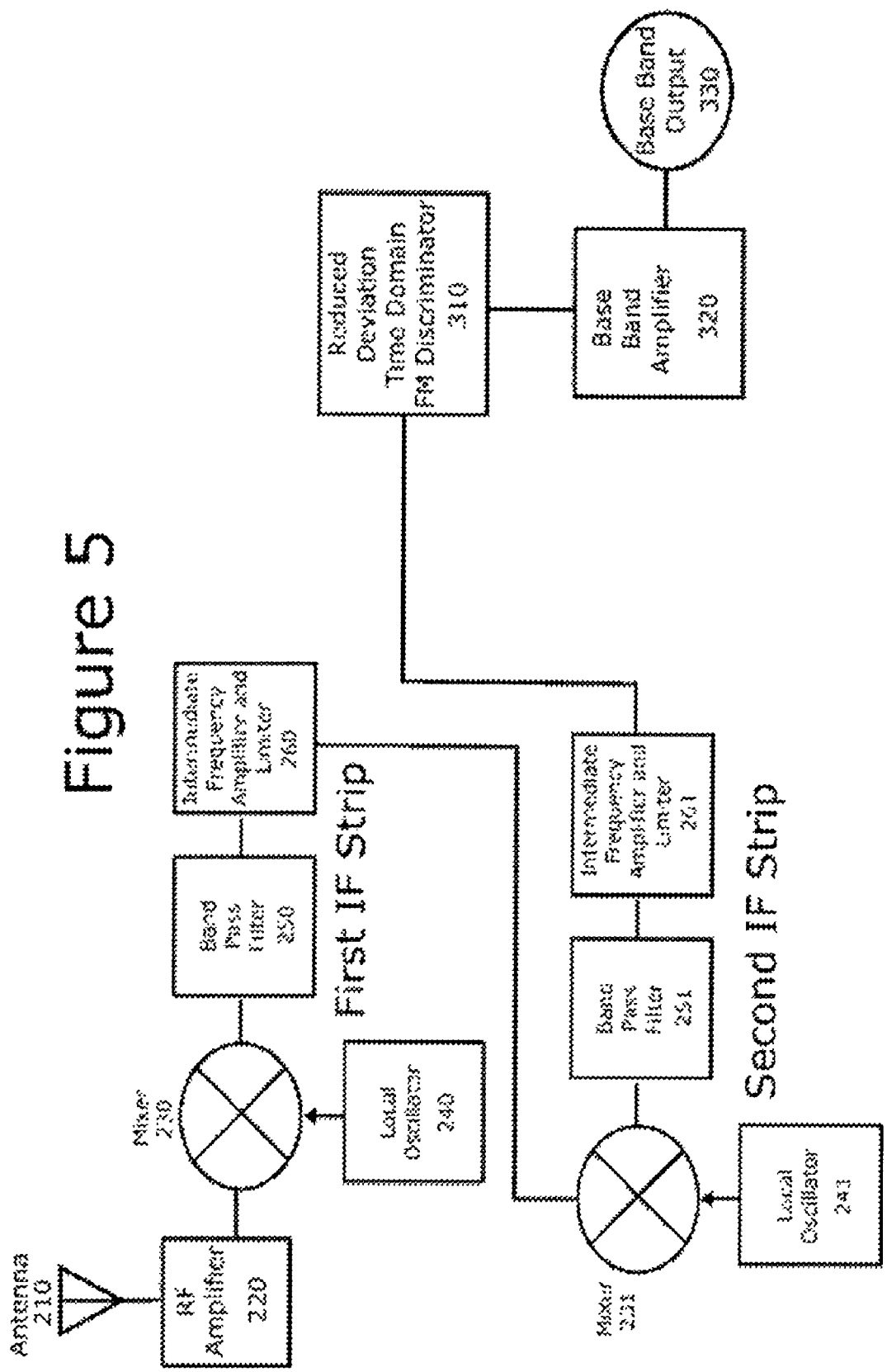
FIG. 5: Shows the block diagram of an preferred embodiment of a double conversion, low frequency deviation, FM or PM receiver constructed in accordance with the present invention.

FIG. 5 shows a block diagram of a preferred embodiment of a double conversion FM receiver for receiving the narrow frequency deviation FM signals transmitted from the FM transmitter according to FIG. 1 or 2. Most elements in this embodiment are direct equivalents to those in the exemplary embodiment of the FM receiver shown in FIG. 3, and are not repetitively described. The increased dynamic range of the receiver, and out-of-band signal rejection, is implemented using a double conversion superheterodyne IF (Intermediate Frequency) scheme. A second IF (Intermediate Frequency) strip is added to the FM receiver using the following elements:

The output of the first IF (Intermediate Frequency) amplifier/limiter (FIG. 4-260), is followed in the alternative embodiment by a RF mixer (FIG. 4-231), with an associated local oscillator (FIG. 4-241) to down-convert the first IF (Intermediate Frequency) signal frequency into a suitable second IF (Intermediate Frequency) signal frequency. The completed RF mixer stage (FIG. 4-231) is followed by a band pass filter (FIG. 4-251) centered on the second IF (Intermediate Frequency) signal frequency. The second IF (Intermediate Frequency) band pass filter removes the unwanted mixer image and any DC component from the second IF (Intermediate Frequency) signal. The second IF (Intermediate Frequency) frequency band pass filter (FIG. 4-251) is succeeded by the second IF (Intermediate Frequency) amplifier/limiter (FIG. 4-261). The second IF (Intermediate Frequency) amplifier/limiter eliminates all remaining traces of the amplitude variations from the processed signal.

The second IF (Intermediate Frequency) strip removes interference from out-of-band signals and the first IF (Intermediate Frequency) strips mixer images.

Figure 6:
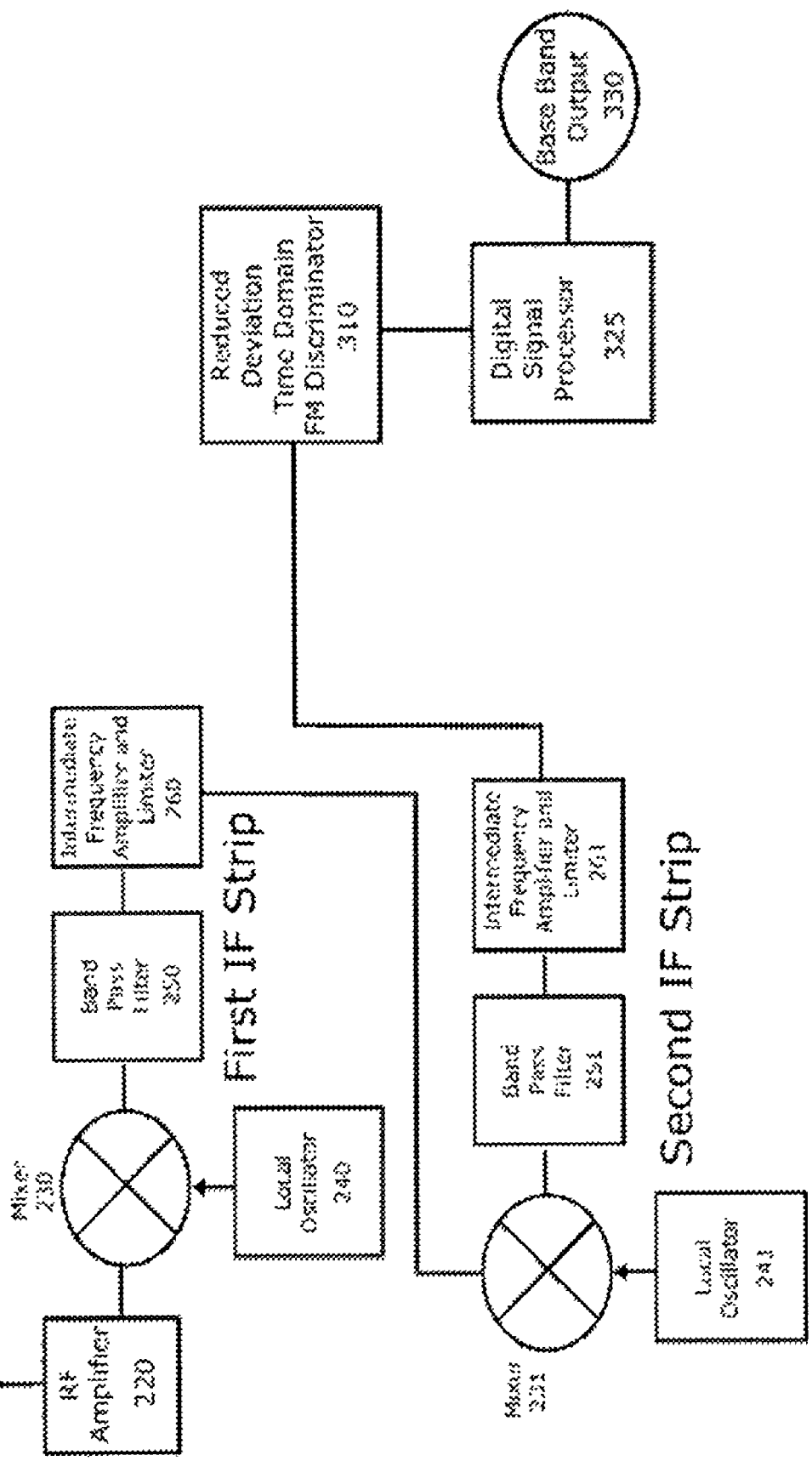
FIG. 6: Shows the block diagram of an alternative embodiment of a double conversion, low frequency deviation, FM or PM receiver constructed in accordance with the present invention.

FIG. 6 shows a block diagram of an alternative embodiment of a double conversion FM receiver for receiving the narrow frequency deviation FM signals transmitted from the FM transmitter according to FIG. 1 or 2. Most elements in this embodiment are direct equivalents to those in the exemplary embodiment of the FM receiver shown in FIG. 3, and are not repetitively described. The reduced deviation time domain FM/PM discriminator circuit stage (FIG. 3-310) is followed by using a DSP base band processor (FIG. 6-325). The DSP base band processor (FIG. 6-325) demodulates the low frequency deviation FM signal using digital filter techniques to obtain the base band information. The block diagram in FIG. 6 exemplifies the major advantage when the low frequency deviation FM receiver is constructed in accordance with the present invention. The output of the reduced deviation time domain FM/PM discriminator circuit stage (FIG. 6-310) is in a digital format. There is no information loss in digitizing the analog output base band signals, as in conventional analog methods of detecting FM signals which require digitizing the analog output base band signals, using a low deviation FM receiver constructed in accordance with the present invention because the reduced deviation time domain FM/PM discriminator circuit stage (FIG. 6-310) output is in a digital format. The direct digital output of the base band signals from the reduced deviation time domain FM/PM discriminator circuit stage (FIG. 6-310) represents a significant improvement over existing low deviation receiver techniques where the output of ether the IF string must be digitized or the base band output of the FM discriminator.

Figure 7:
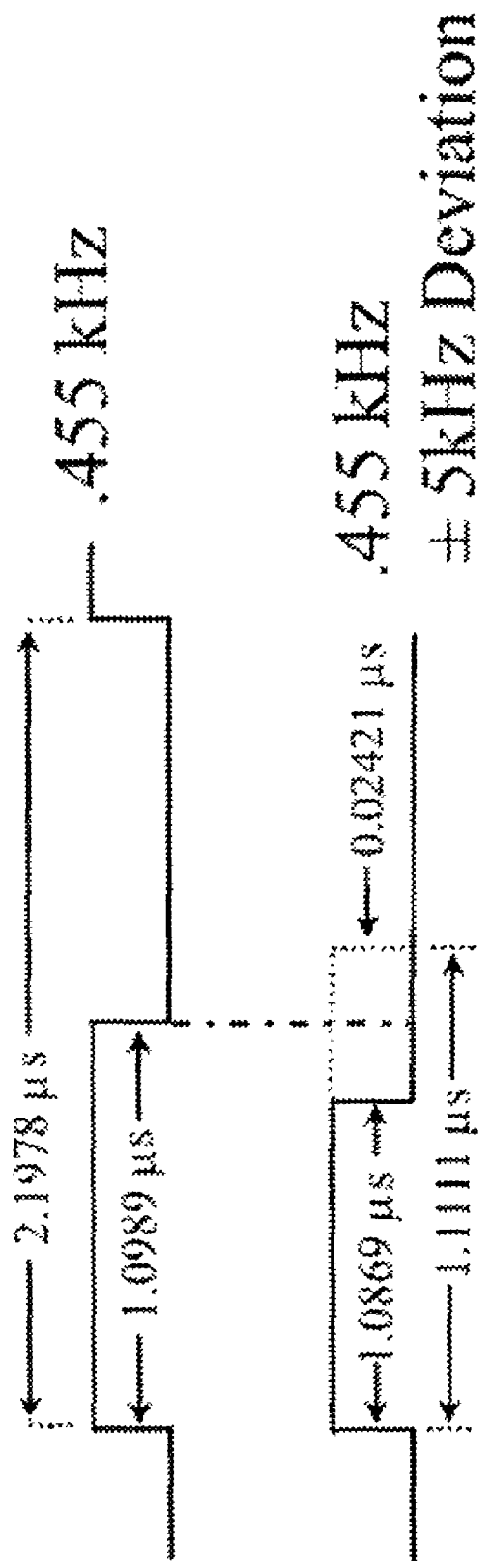
FIG. 7: Shows the deviation timing diagram of a FM modulated signal in accordance with the present invention.

FIG. 7 shows the period of an FM Signal.

FIG. 8 shows a block diagram of a preferred embodiment to implement an exemplary low frequency deviation FM reduced deviation time domain FM/PM discriminator circuit in FIG. 3 (i.e. FIG. 3-310), FIG. 4 (i.e. FIG. 4-310), FIG. 5 (i.e. FIG. 5-310, and FIG. 6 (i.e. FIG. 6-310) to expand narrow, or reduced frequency deviation FM (or PM) modulation signals as transmitted from the transmitter according to FIG. 1 or 2. The narrow band, or reduced deviation FM signal from the Intermediate Frequency Amplifier and Limiter in FIG. 3 (i.e. FIG. 3-260), FIG. 4 (i.e. FIG. 4-260), FIG. 5 (i.e. FIG. 5-260), and FIG. 6 (i.e. FIG. 6-260) provides the Reduced Deviation FM Signal (FIG. 8-261). According to the circuit of the FM reduced deviation time domain FM/PM discriminator circuit in FIG. 8, the Reduced Deviation FM Signal (FIG. 8-261) is connected to the input of the analog-to-logic level converter (FIG. 8-440). The logic level converter (FIG. 8-440) detects the zero crossings of the Reduced Deviation FM Signal (FIG. 8-261). The logic level converter (FIG. 8-440) is followed by the pulse generator (FIG. 8-400) with a fixed duration of one half the center frequency period of the Reduced Deviation FM Signal (FIG. 8-261). An exclusive-or gate (FIG. 8-410) follows the pulse generator (FIG. 8-400) connecting one input of the exclusive-or gate (FIG. 8-410) to the output of the pulse generator (FIG. 8-400) and connecting the second input of the exclusive-or gate (FIG. 8-410) to the logic level converter (FIG. 8-440) output. The output of the exclusive-or gate (FIG. 8-410) measures the time difference between the period of the Reduced Deviation FM Signal (FIG. 8-261), and the period of the pulse generator (FIG. 8-400) by emitting a pulse equal to the time difference between the period of the Reduced Deviation FM Signal (FIG. 8-261), and the period of the pulse generator (FIG. 8-400). The exclusive-or gate (FIG. 8-410) is followed by the AND gate (FIG. 8-420) connecting one input of the AND gate (FIG. 8-420) to the output of the exclusive-or gate (FIG. 8-410). The second input of the AND gate (FIG. 8-420) is connected to a clock (FIG. 8-421). The first input of the AND gate (FIG. 8-420) connected to the output of the exclusive-or gate (FIG. 8-410) provides a gating or control function to provide a series of pulses, at the frequency of the clock (FIG. 8-421), equal in duration to the time difference between the period of the Reduced Deviation FM Signal (FIG. 8-261), and the period of the pulse generator (FIG. 8-400). The number of pulses from the AND gate (FIG. 8-420) is a count, or digitized value of the frequency deviation of the frequency modulated signal or the difference of the two frequencies, the frequency of the Reduced Deviation FM Signal (FIG. 8-261) and the frequency of the pulse generator (FIG. 8-400), regardless whether the base band modulating signal is digital or analog. The AND gate (FIG. 8-420) is followed by the Counter (FIG. 8-430) with the output of the AND gate (FIG. 8-420) being connected to a clock input of the Counter (FIG. 8-430). The up/down input of the Counter (FIG. 8-430) is connected to the logic level converter (FIG. 8-440). The control signal (up/down) from the logic level converter (FIG. 8-440) causes the Counter (FIG. 8-430) to count in one direction when the period of the control signal (up/down) from the Reduced Deviation FM Signal (FIG. 8-261) is shorter than the period of the pulse generator (FIG. 8-400). The Counter (FIG. 8-430 counts in the opposite direction when the period of the control signal (up/down) from the Reduced Deviation FM Signal (FIG. 8-261) is longer than the period of the pulse generator (FIG. 8-400). The logic level converter (FIG. 8-440) is also followed by the control circuitry (FIG. 8-450). The control circuitry (FIG. 8-450) uses the logic control signal from the logic level converter (FIG. 8-440) to generate a logical control signal to clock the data from the counter (FIG. 8-430) to the latch (FIG. 8-460) that follows the control circuitry (FIG. 8-450) on the positive transition of the Reduced Deviation FM Signal (FIG. 8-261). The value of the counter (FIG. 8-430) transferred to the latch (FIG. 8-460) represents the difference in frequency between the FM signal's center frequency and the instantaneous FM carrier frequency the frequency deviation of the FM signal at the particular instant in time the carrier was being sampled using the reduced deviation time domain FM/PM discriminator circuit under the constraint that the IF carrier frequency is much greater than the highest base band frequency. Following the clocking of the data from the counter (FIG. 8-430) to the latch (FIG. 8-460), a logic control signal from the control circuitry (FIG. 8-450) clears the data from the counter (FIG. 8-430).

The latch (FIG. 8-460) is followed by the Digital to Analog Converter (FIG. 8-470) to convert the digitized base band signal from the latch (FIG. 8-460) to be converted back to a base band analog signal.

The Digital to Analog Converter (FIG. 8-470) is followed by the base band amplifier (FIG. 8-480) to amplify the base band analog signal to a useful level to drive speakers, interface to computers, etc.

Figure 9:
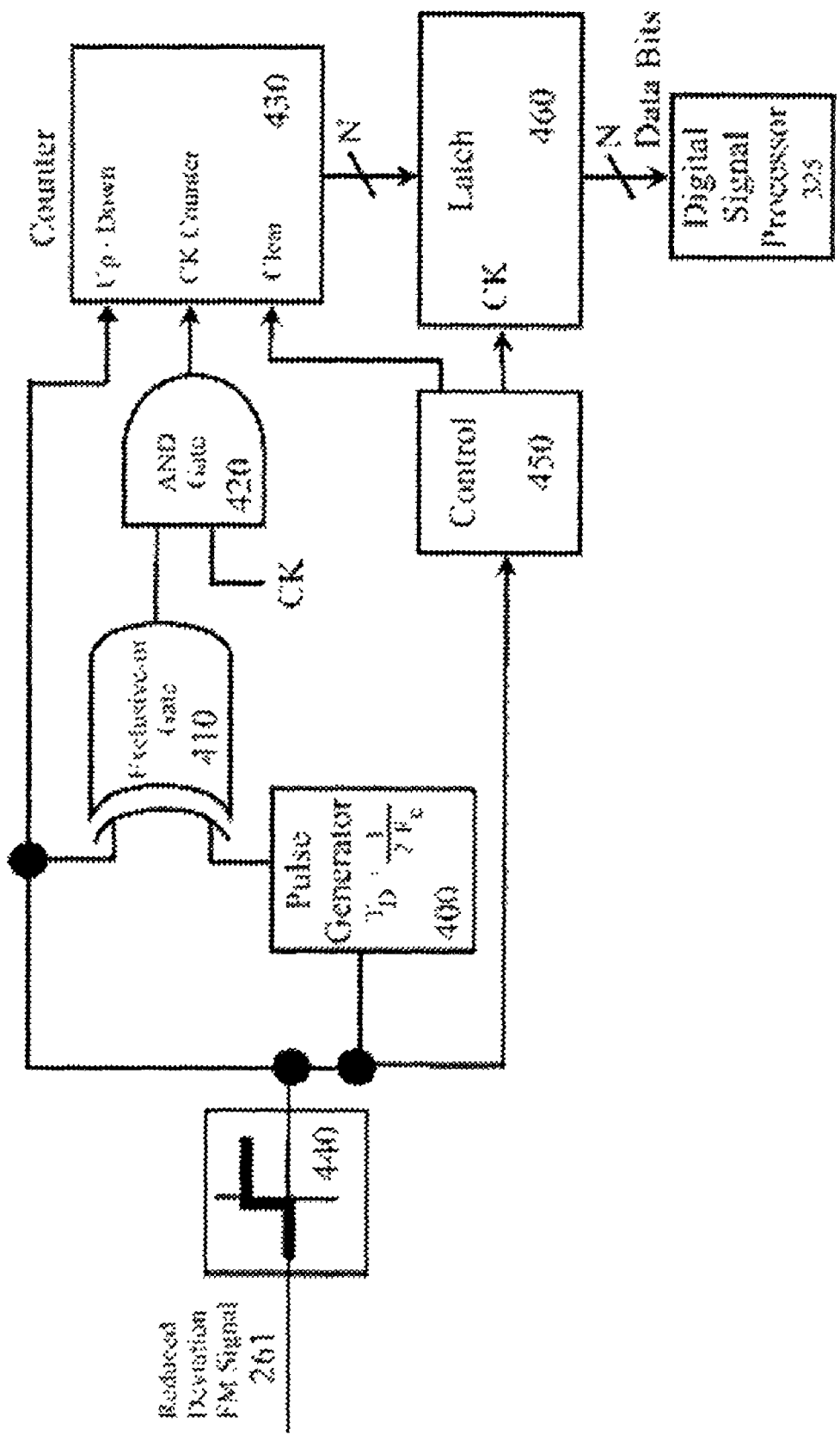
FIG. 9: Shows the block diagram of an alternative embodiment of a low frequency deviation FM or PM reduced deviation time domain FM/PM discriminator circuit using a DSP base band processor constructed in accordance with the present invention.

FIG. 9 shows a block diagram of an alternative embodiment of an exemplary low frequency deviation FM reduced deviation time domain FM/PM discriminator circuit in FIG. 8 to expand narrow, or reduced frequency deviation FM (or PM) modulation signals as transmitted from the transmitter according to FIG. 1 or 2. Most elements in this exemplary embodiment are direct equivalents to those in the preferred embodiment of the FM receiver shown in FIG. 8, and are not repetitively described.

The latch (FIG. 9-460) is followed by using a DSP base band processor (FIG. 9-325). The DSP base band processor (FIG. 9-325) demodulates the low frequency deviation FM signal using digital filter techniques to obtain the base band information. The block diagram in FIG. 9 exemplifies the major advantage when the low frequency deviation FM receiver constructed in accordance with the present invention. The output of the reduced deviation time domain FM/PM discriminator circuit stage (FIG. 9-310) is in a digital format. There is no information loss in digitizing the analog output base band signals, as in conventional analog methods of detecting FM signals which require digitizing the analog output base band signals, using a low deviation FM receiver constructed in accordance with the present invention, because the reduced deviation time domain FM/PM discriminator circuit stage (FIG. 9-310) output is in a digital format. The direct digital output of the base band signals from the reduced deviation time domain FM/PM discriminator circuit stage (FIG. 9-310) represents a significant improvement over existing low deviation receiver techniques where the output of ether the IF string must be digitized or the base band output of the FM discriminator.

Figure 10:
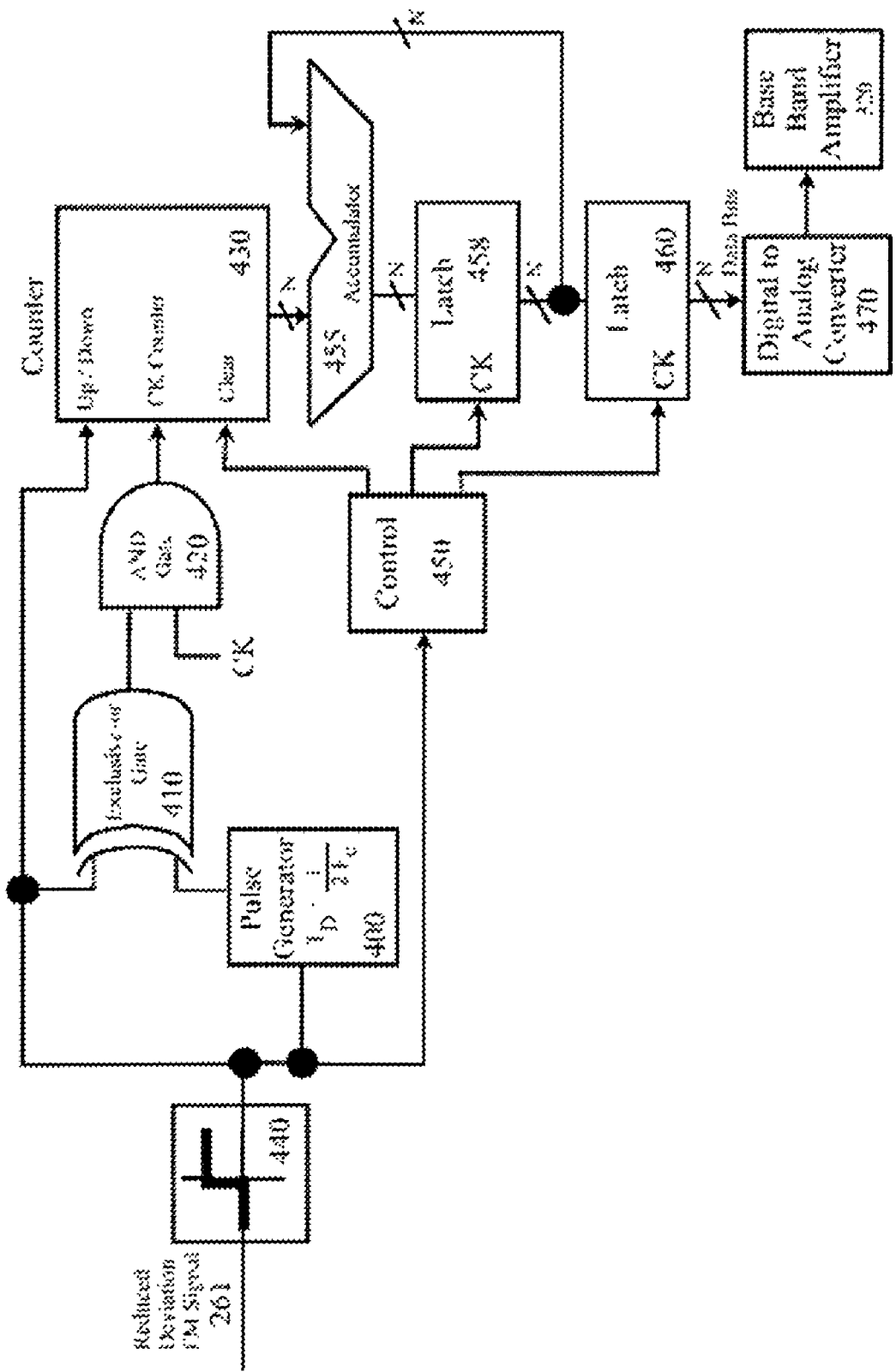
FIG. 10: Shows the block diagram of a preferred embodiment of a low frequency deviation FM or PM reduced deviation time domain FM/PM discriminator circuit using a digital accumulator constructed in accordance with the present invention.

FIG. 10 shows a block diagram of an alternative embodiment of an exemplary low frequency deviation FM reduced deviation time domain FM/PM discriminator circuit in FIG. 8 to expand narrow, or reduced frequency deviation FM (or PM) modulation signals as transmitted from the transmitter according to FIG. 1 or 2. Most elements in this exemplary embodiment are direct equivalents to those in the preferred embodiment of the FM receiver shown in FIG. 8, and are not repetitively described. The Counter (FIG. 10-430) is followed by the Accumulator (FIG. 10-455) with the output of the Accumulator (FIG. 10-455) being connected to the data input of latch (FIG. 10-458). The clock input of the latch (FIG. 10-458) is connected to the control circuitry (FIG. 10-450). The latch (FIG. 10-458) is followed by the latch (FIG. 10-460), and the second data input of Accumulator (FIG. 10-455). The latch (FIG. 10-460) is followed by the Digital to Analog Converter (FIG. 10-470).

The control circuitry (FIG. 10-450) uses the logic control signal from the logic level converter (FIG. 10-440) to generate a logical control signal to clock the data from the counter (FIG. 10-430) through the Accumulator (FIG. 10-455) into the latch (FIG. 10-458) that follows the control circuitry (FIG. 10-450) on the positive transition of the Reduced Deviation FM Signal (FIG. 10-261). The value of the counter (FIG. 10-430) transferred to the latch (FIG. 10-460) represents the difference in frequency between the FM signal's center frequency and the instantaneous FM carrier frequency or the frequency deviation of the FM signal at the particular instant in time the carrier was being sampled using the FM reduced deviation time domain FM/PM discriminator circuit under the constraint that the IF carrier frequency is much greater than the highest base band frequency. The control circuitry (FIG. 10-450) is configured to add successive samples of the difference in frequency between the FM signal's center frequency and the instantaneous FM carrier frequency or the frequency deviation of the FM signal to increase the digitizing accuracy. After the desired number of samples of the frequency deviation are summed, the result is transferred to the latch (FIG. 10-460) with a clock pulse from the control circuitry (FIG. 10-450) to the clock control input of to the latch (FIG. 10-460). Next, a clear pulse is sent from the control circuitry (FIG. 10-450) to the clear input on the Counter (FIG. 10-430), and a clock pulse is sent to the clock control input of to the latch (FIG. 10-458) to clear or reset the latch (FIG. 10-458).

The accuracy of measurement of the frequency deviation of the instantaneous FM carrier frequency from the FM carrier center frequency is increased by using the fact that the IF frequency of a receiver is many times greater than the highest component of the base band signal, whether the base band signal is digital or analog. The frequency deviation of the instantaneous FM carrier frequency is being grossly over sampled. Successive samples can be combined directly to increase the accuracy of the estimation of the instantaneous FM carrier frequency from the FM carrier center frequency, with the penalty of having a lower sampling rate.

Figure 11:
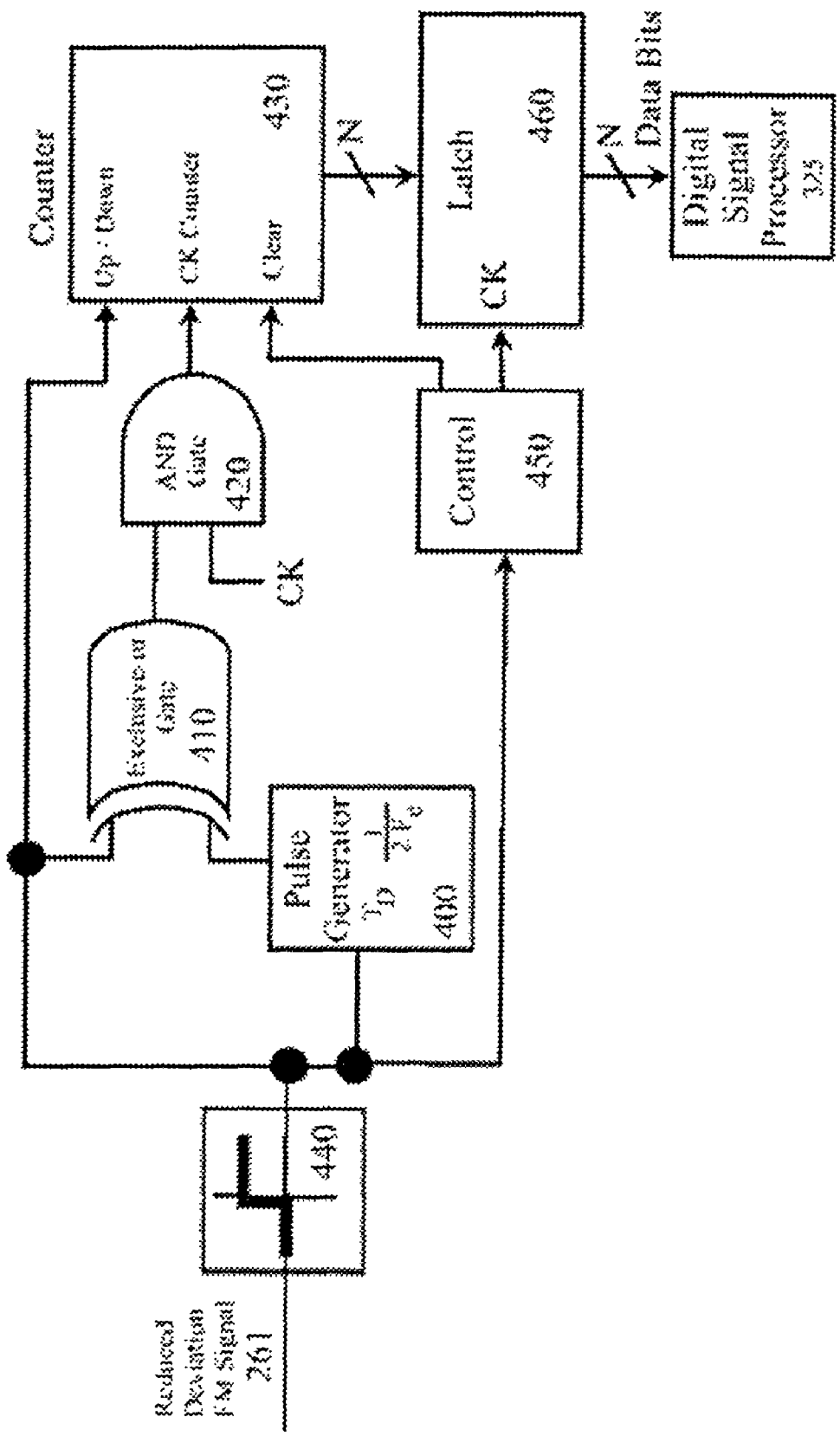
FIG. 11: Shows the block diagram of an alternative embodiment of a low frequency deviation FM or PM reduced deviation time domain FM/PM discriminator using a digital accumulator circuit, and using a DSP base band processor constructed in accordance with the present invention.

FIG. 11 shows a block diagram of an alternative embodiment of an exemplary low frequency deviation FM reduced deviation time domain FM/PM discriminator circuit in FIG. 8 to expand narrow, or reduced frequency deviation FM (or PM) modulation signals as transmitted from the transmitter according to FIG. 1 or 2. Most elements in this exemplary embodiment are direct equivalents to those in the preferred embodiment of the FM receiver shown in FIG. 8, and are not repetitively described. The latch (FIG. 11-460) is followed by a DSP base band processor (FIG. 11-325). The DSP base band processor (FIG. 11-325) performs a decimation function on the low frequency deviation FM signal using digital filter techniques to lower the sampling rate to obtain the base band information. During decimation the accuracy of the digital representation of the frequency deviation is increased tremendously, and the base band signal is band pass filtered eliminating out of band noise. The block diagram in FIG. 11 exemplifies the major advantage when the low frequency deviation FM receiver constructed in accordance with the present invention. The output of the reduced deviation time domain FM/PM discriminator circuit stage (FIG. 11-325) is in a digital format. There is no information loss in digitizing the analog output base band signals, as in conventional analog methods of detecting FM signals which require digitizing the analog output base band signals, using a low deviation FM receiver constructed in accordance with the present invention Because the reduced deviation time domain FM/PM discriminator circuit stage (FIG. 11-325) output is in a digital format. The direct digital output of the base band signals from the reduced deviation time domain FM/PM discriminator circuit stage (FIG. 11-325) represents a significant improvement over existing low deviation receiver techniques where the output of either the IF string must be digitized or the base band output of the FM discriminator.

Figure 12:
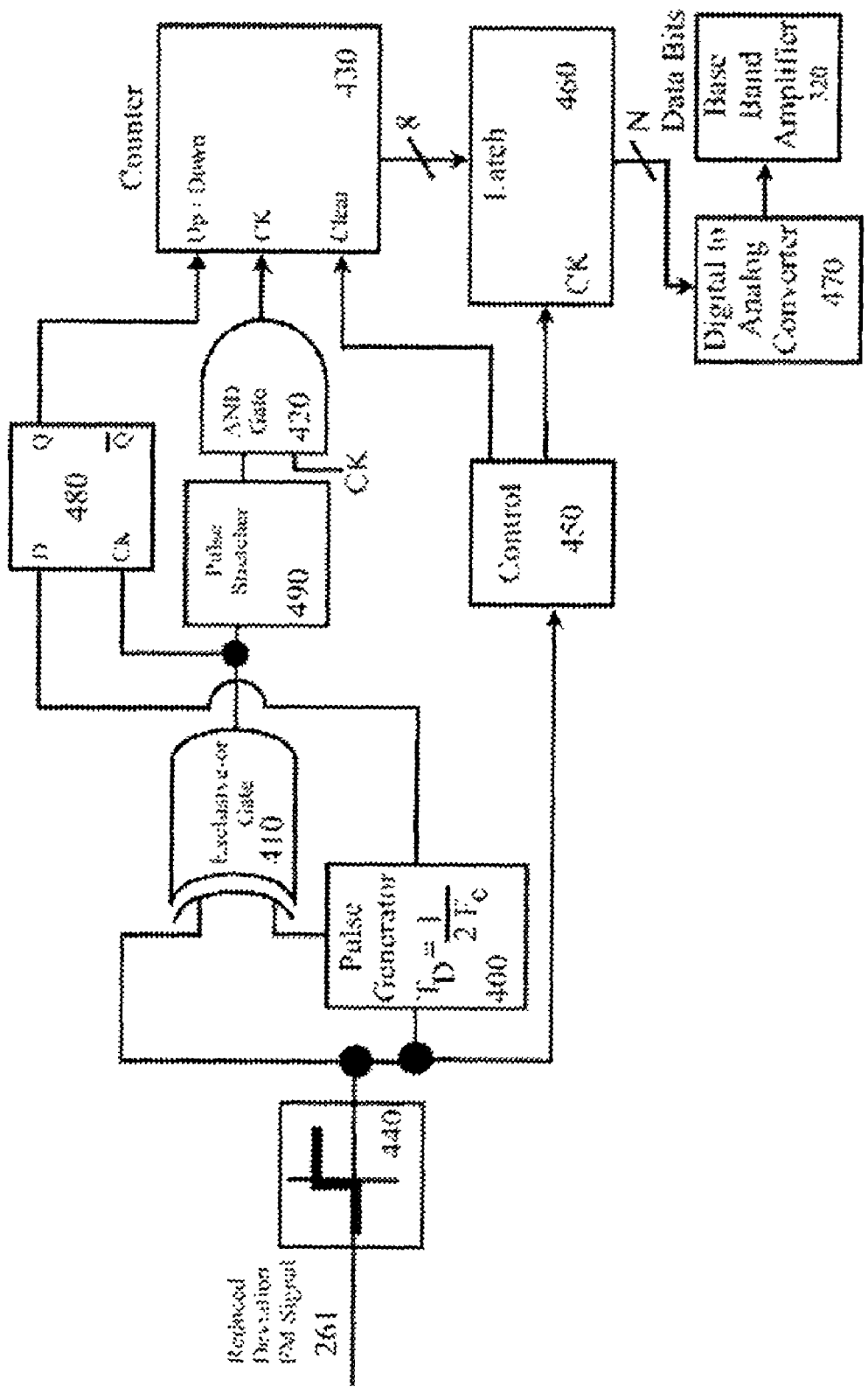
FIG. 12: Shows the block diagram of a preferred embodiment of a low frequency deviation FM or PM reduced deviation time domain FM/PM discriminator circuit using a time domain pulse stretcher constructed in accordance with the present invention.
Figure 13:
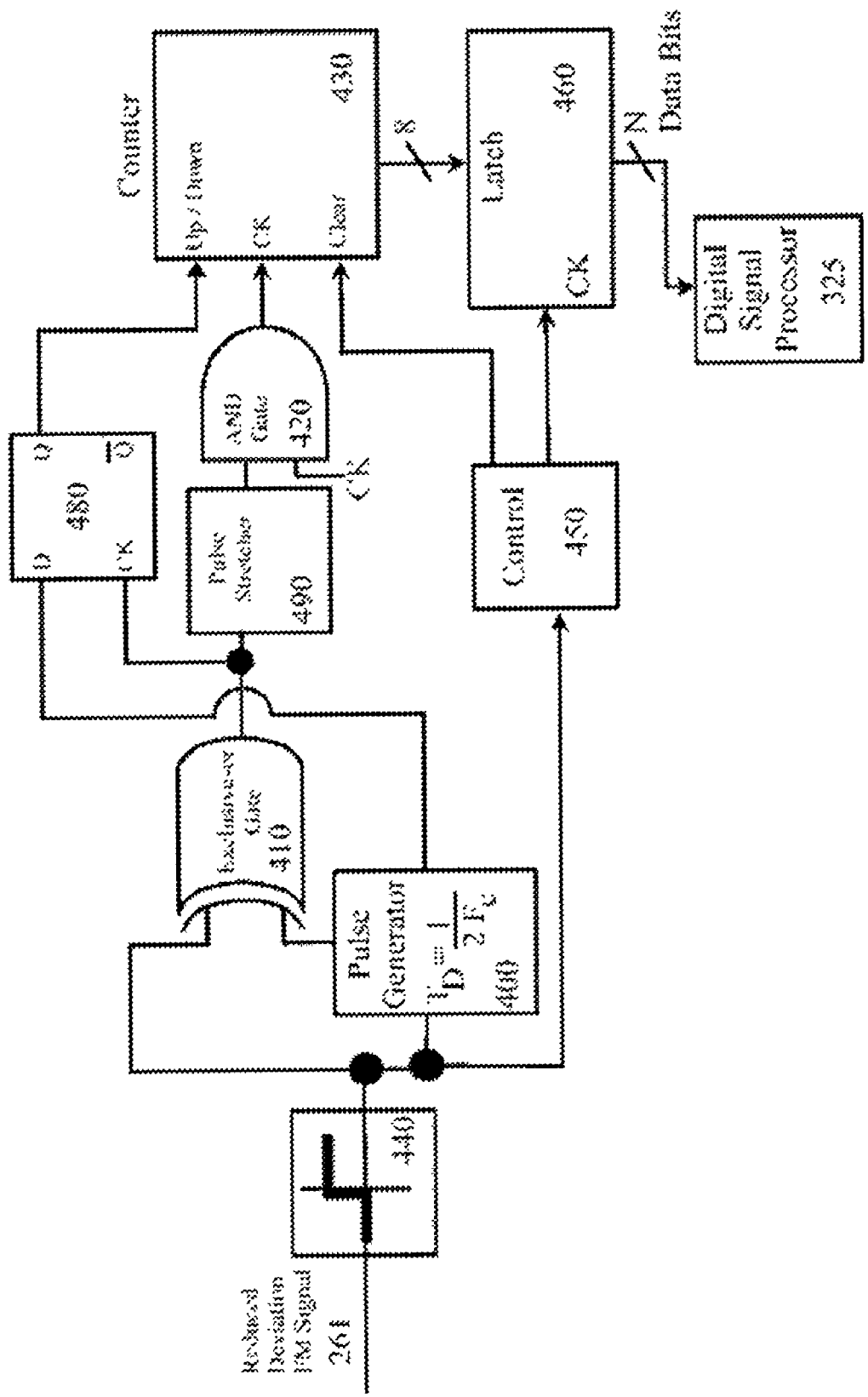
FIG. 13: Shows the block diagram of an alternative embodiment of a low frequency deviation FM or PM reduced deviation time domain FM/PM discriminator circuit using a DSP base band processor, and a time domain pulse stretcher constructed in accordance with the present invention.

FIG. 13 shows a block diagram of an alternative embodiment of an exemplary low frequency deviation reduced deviation time domain FM/PM discriminator circuit in FIG. 12 to expand narrow, or reduced frequency deviation FM (or PM) modulation signals as transmitted from the transmitter according to FIG. 1 or 2. Most elements in this exemplary embodiment are direct equivalents to those in the preferred embodiment of the FM receiver shown in FIG. 9, and are not repetitively described.

The output of the exclusive-or gate (FIG. 13-410) measures the time difference (the frequency deviation) between the period of the Reduced Deviation FM Signal (FIG. 13-261), and the period of the pulse generator (FIG. 13-400) by emitting a pulse equal to the time difference between the period of the Reduced Deviation FM Signal (FIG. 13-261), and the period of the pulse generator (FIG. 13-400). To time expand the difference pulse, the pulse stretcher circuit (FIG. 13-490) follows the exclusive-or gate (FIG. 13-410). The pulse stretcher circuit multiplies the time duration of the difference pulse. This has the effect of multiplying the accuracy of the reduced deviation time domain FM/PM discriminator circuit. The pulse stretcher circuit (FIG. 13-490) is followed by the AND gate (FIG. 13-420) connecting one input of the AND gate (FIG. 13-420) to the output of the exclusive-or gate (FIG. 13-410). The circuitry must remember "the polarity" of the stretch frequency deviation or difference pulse while the Counter (FIG. 13-430) is counting. The D flip-flop (FIG. 13-480) clock input follows the pulse generator (FIG. 13-400), and the D flip-flop (FIG. 13-480) clock input follows the output of exclusive-or gate (FIG. 13-410). The D flip-flop (FIG. 13-480) is strobed by the signal from the exclusive-or gate (FIG. 13-410) remembering the polarity of the pulse generator (FIG. 13-400). The up/down input of the Counter (FIG. 13-430) is connected to the D flip-flop (FIG. 13-480). The control signal (up/down) from the logic level converter (FIG. 13-440) causes the Counter (FIG. 13-430) to count in one direction when the period of the control signal (up/down) from the Reduced Deviation FM Signal (FIG. 13-261) is shorter than the period of the pulse generator (FIG. 8-400). The Counter (FIG. 12-430 counts in the opposite direction when the period of the control signal (up/down) from the Reduced Deviation FM Signal (FIG. 13-261) is longer than the period of the pulse generator (FIG. 13-400).

Figure 14:
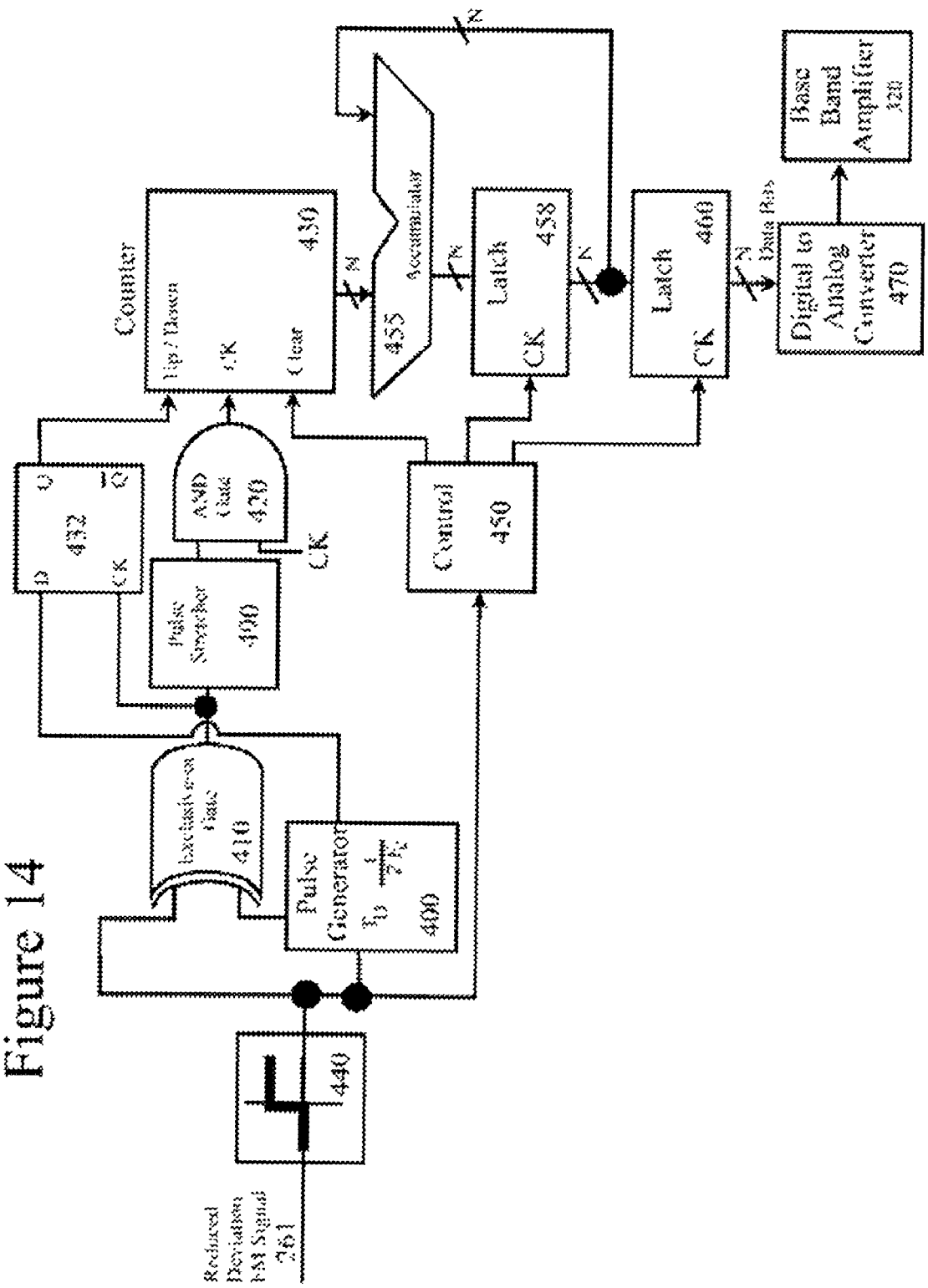
FIG. 14: Shows the block diagram of a preferred embodiment of a low frequency deviation FM or PM reduced deviation time domain FM/PM discriminator circuit using a time domain pulse stretcher, and a digital accumulator constructed in accordance with the present invention.

FIG. 14 shows a block diagram of an alternative embodiment of an exemplary low frequency deviation FM reduced deviation time domain FM/PM discriminator circuit in FIG. 8 to expand narrow, or reduced frequency deviation FM (or PM) modulation signals as transmitted from the transmitter according to FIG. 1 or 2. Most elements in this exemplary embodiment are direct equivalents to those in the exemplary embodiment of the FM receiver shown in FIG. 10, and are not repetitively described.

The output of the exclusive-or gate (FIG. 14-410) measures the time difference (the frequency deviation) between the period of the Reduced Deviation FM Signal (FIG. 14-261), and the period of the pulse generator (FIG. 14-400) by emitting a pulse equal to the time difference between the period of the Reduced Deviation FM Signal (FIG. 14-261), and the period of the pulse generator (FIG. 14-400). To time expand the difference pulse, the pulse stretcher circuit (FIG. 12-490) follows the exclusive-or gate (FIG. 14-410). The pulse stretcher circuit multiplies the time duration of the difference pulse. This has the effect of multiplying the accuracy of the reduced deviation time domain FM/PM discriminator circuit. The pulse stretcher circuit (FIG. 14-490) is followed by the AND gate (FIG. 14-420) connecting one input of the AND gate (FIG. 14-420) to the output of the exclusive-or gate (FIG. 14-410). The circuitry must remember "the polarity" of the stretch frequency deviation or difference pulse while the Counter (FIG. 14-430) is counting. The D flip-flop (FIG. 14-480) clock input follows the pulse generator (FIG. 14-400), and the D flip-flop (FIG. 14-480) clock input follows the output of exclusive-or gate (FIG. 14-410). The D flip-flop (FIG. 14-480) is strobed by the signal from the exclusive-or gate (FIG. 14-410) remembering the polarity of the pulse generator (FIG. 14-400). The up/down input of the Counter (FIG. 14-430) is connected to the D flip-flop (FIG. 14-480). The control signal (up/down) from the logic level converter (FIG. 14-440) causes the Counter (FIG. 14-430) to count in one direction when the period of the control signal (up/down) from the Reduced Deviation FM Signal (FIG. 14-261) is shorter than the period of the pulse generator (FIG. 14-400). The Counter (FIG. 14-430 counts in the opposite direction when the period of the control signal (up/down) from the Reduced Deviation FM Signal (FIG. 14-261) is longer than the period of the pulse generator (FIG. 14-400). The circuit also include the accumulator circuitry described with reference to FIG. 10.

Figure 15:
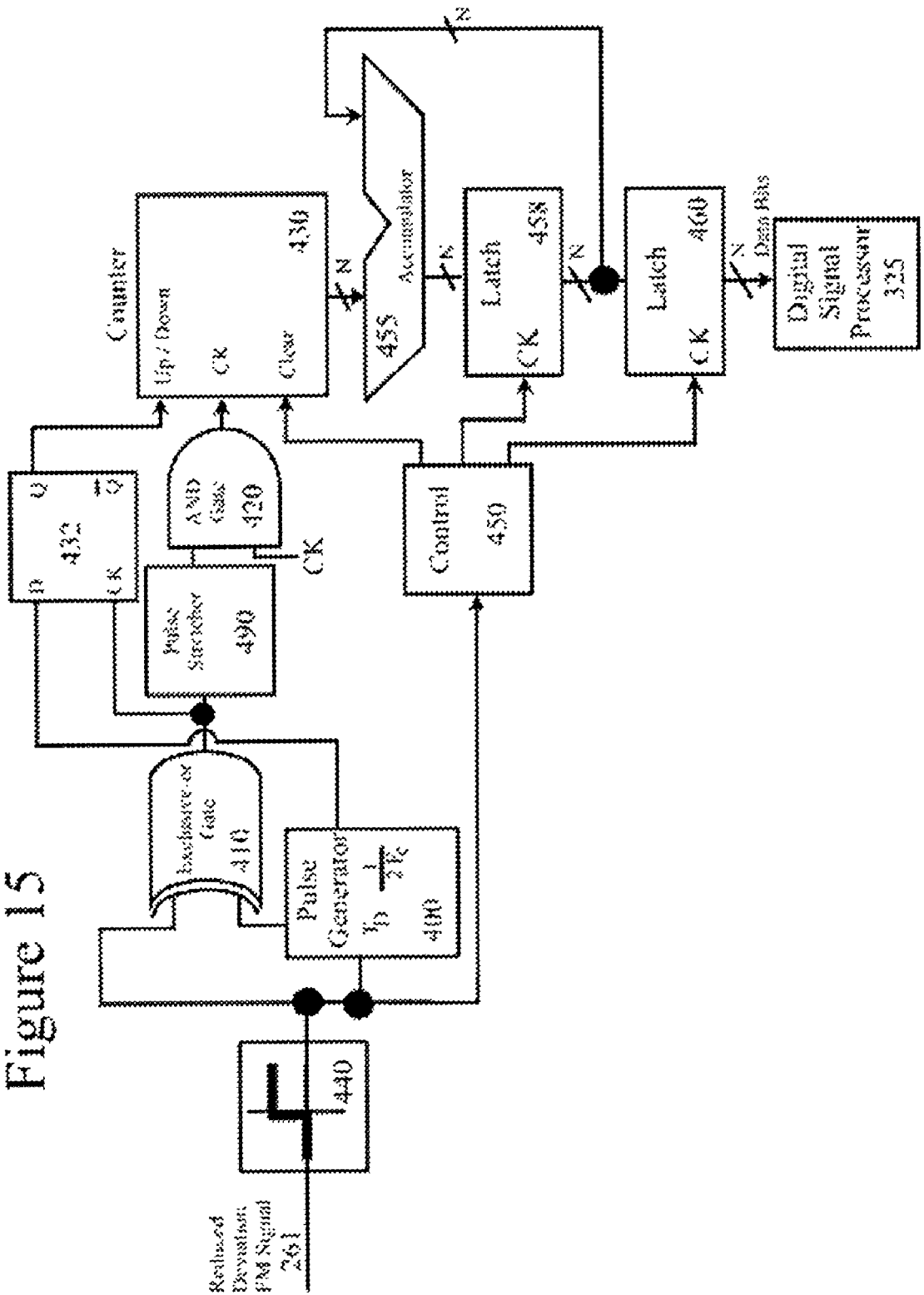
FIG. 15: Shows the block diagram of an alternative embodiment of a low frequency deviation FM or PM reduced deviation time domain FM/PM discriminator using a time domain pulse stretcher, a digital accumulator circuit and using a DSP base band processor constructed in accordance with the present invention.

FIG. 15 shows a block diagram of a alternative embodiment of an exemplary low frequency deviation FM reduced deviation time domain FM/PM discriminator circuit in FIG. 8 to expand narrow, or reduced frequency deviation FM (or PM) modulation signals as transmitted from the transmitter according to FIG. 1 or 2. Most elements in this embodiment are direct equivalents to those in the alternative embodiment of the FM receiver shown in FIG. 11, and are not repetitively described.

The output of the exclusive-or gate (FIG. 15-410) measures the time difference (the frequency deviation) between the period of the Reduced Deviation FM Signal (FIG. 15-261), and the period of the pulse generator (FIG. 15-400) by emitting a pulse equal to the time difference between the period of the Reduced Deviation FM Signal (FIG. 15-261), and the period of the pulse generator (FIG. 15-400). To time expand the difference pulse, the pulse stretcher circuit (FIG. 15-490) follows the exclusive-or gate (FIG. 15-410). The pulse stretcher circuit multiplies the time duration of the difference pulse. This has the effect of multiplying the accuracy of the reduced deviation time domain FM/PM discriminator circuit. The pulse stretcher circuit (FIG. 15-490) is followed by the AND gate (FIG. 5-420) connecting one input of the AND gate (FIG. 5-420) to the output of the exclusive-or gate (FIG. 5-410). The circuitry must remember "the polarity" of the stretch frequency deviation or difference pulse while the Counter (FIG. 15-430) is counting. The D flip-flop (FIG. 15-480) clock input follows the pulse generator (FIG. 15-400), and the D flip-flop (FIG. 15-480) clock input follows the output of exclusive-or gate (FIG. 15-410). The D flip-flop (FIG. 15-480) is strobed by the signal from the exclusive-or gate (FIG. 15-410) remembering the polarity of the pulse generator (FIG. 15-400). The up/down input of the Counter (FIG. 15-430) is connected to the D flip-flop (FIG. 15-480). The control signal (up/down) from the logic level converter (FIG. 15-440) causes the Counter (FIG. 15-430) to count in one direction when the period of the control signal (up/down) from the Reduced Deviation FM Signal (FIG. 15-261) is shorter than the period of the pulse generator (FIG. 15-400). The Counter (FIG. 15-430 counts in the opposite direction when the period of the control signal (up/down) from the Reduced Deviation FM Signal (FIG. 15-261) is longer than the period of the pulse generator (FIG. 15-400).

Figure 16:
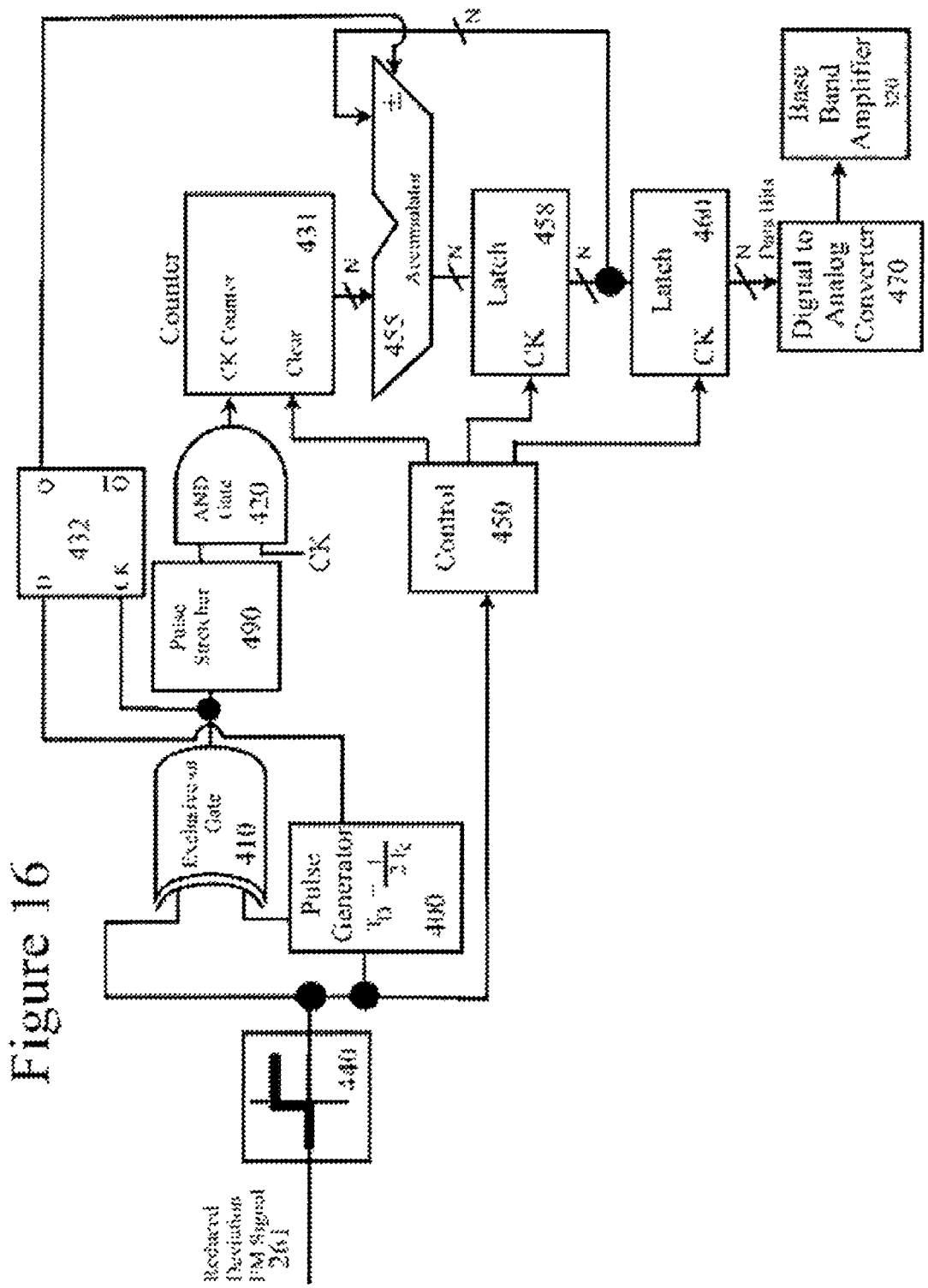
FIG. 16: Shows the block diagram of a preferred embodiment of a low frequency deviation FM or PM reduced deviation time domain FM/PM discriminator circuit using a time domain pulse stretcher, and a digital accumulator constructed in accordance with the present invention.

FIG. 16 shows a block diagram of an alternative embodiment of an exemplary low frequency deviation FM reduced deviation time domain FM/PM discriminator circuit in FIG. 8 to expand narrow, or reduced frequency deviation FM (or PM) modulation signals as transmitted from the transmitter according to FIG. 1 or 2. Most elements in this embodiment are direct equivalents to those in the preferred embodiment of the FM receiver shown in FIG. 14, and are not repetitively described.

The output of the exclusive-or gate (FIG. 16-410) measures the time difference (the frequency deviation) between the period of the Reduced Deviation FM Signal (FIG. 16-261), and the period of the pulse generator (FIG. 16-400) by emitting a pulse equal to the time difference between the period of the Reduced Deviation FM Signal (FIG. 126-261), and the period of the pulse generator (FIG. 16-400). To time expand the difference pulse, the pulse stretcher circuit (FIG. 16-490) follows the exclusive-or gate (FIG. 16-410). The pulse stretcher circuit multiplies the time duration of the difference pulse. This has the effect of multiplying the accuracy of the reduced deviation time domain FM/PM discriminator circuit. The pulse stretcher circuit (FIG. 16-490) is followed by the AND gate (FIG. 6-420) connecting one input of the AND gate (FIG. 6-420) to the output of the exclusive-or gate (FIG. 6-410). The circuitry must remember "the polarity" of the stretch frequency deviation or difference pulse while the Counter (FIG. 16-430) is counting. The D flip-flop (FIG. 16-480) clock input follows the pulse generator (FIG. 16-400), and the D flip-flop (FIG. 16-480) clock input follows the output of exclusive-or gate (FIG. 16-410). The D flip-flop (FIG. 16-480) is strobed by the signal from the exclusive-or gate (FIG. 16-410) remembering the polarity of the pulse generator (FIG. 12-400). The add/subtract input of the Accumulator (FIG. 16-455) is connected to the D flip-flop (FIG. 16-480). The control signal (up/down) from the logic level converter (FIG. 16-440) causes the Accumulator (FIG. 16-455) to add when the period of the control signal (up/down) from the Reduced Deviation FM Signal (FIG. 16-261) is shorter than the period of the pulse generator (FIG. 16-400). The Accumulator (FIG. 16-455) subtracts when the period of the control signal (up/down) from the Reduced Deviation FM Signal (FIG. 16-261) is longer than the period of the pulse generator (FIG. 16-400).

Figure 17:
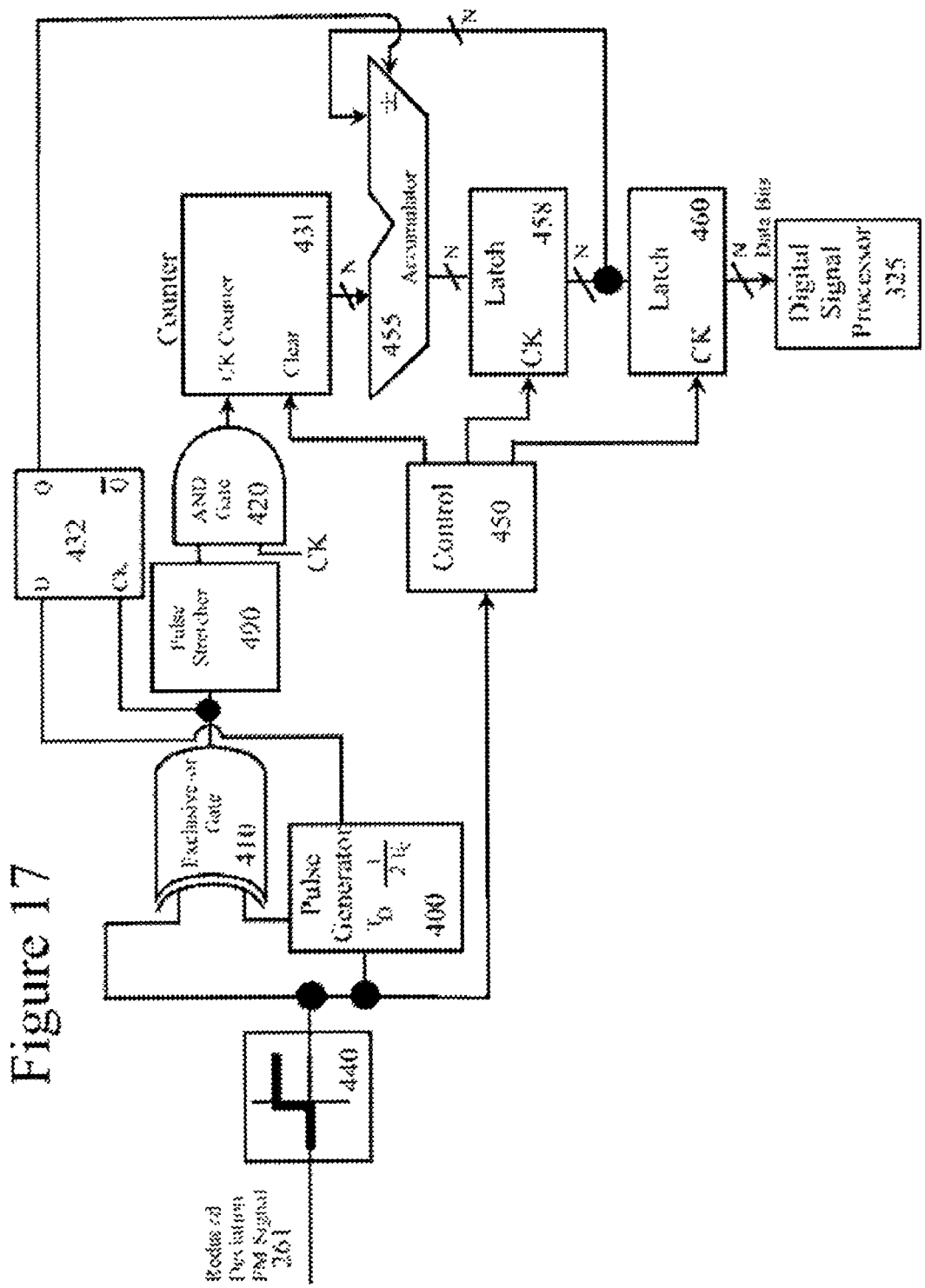
FIG. 17: Shows the block diagram of an alternative embodiment of a low frequency deviation FM or PM reduced deviation time domain FM/PM discriminator using a time domain pulse stretcher, a digital accumulator circuit, and using a DSP base band processor constructed in accordance with the present invention.

FIG. 17 shows a FM reduced deviation time domain FM/PM discriminator circuit as in FIG. 16 employing a digital signal processor in place of the digital to analog converter and the base band amplifier.

Figure 18:
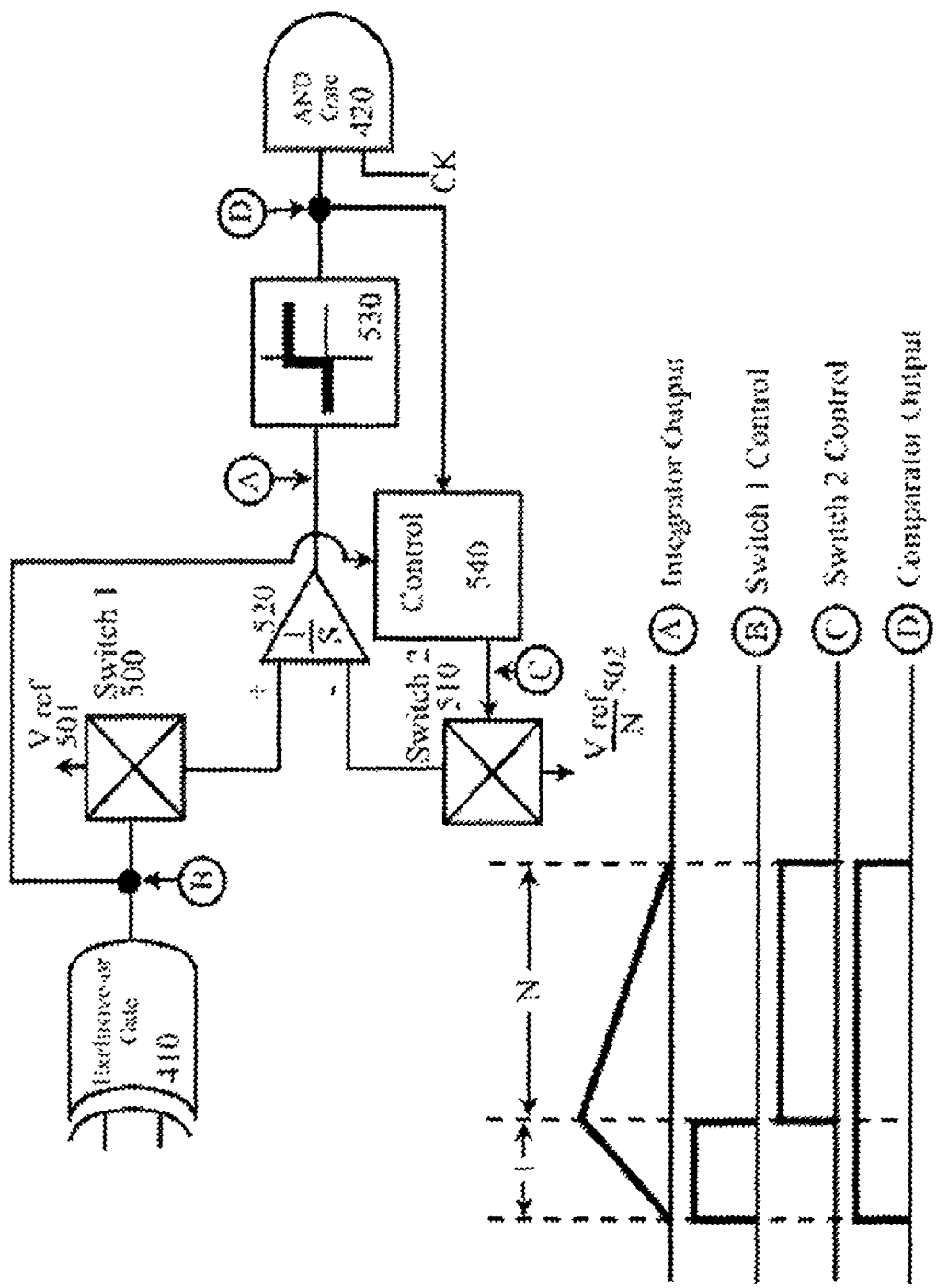
FIG. 18: Shows the block diagram of a preferred embodiment of a low frequency deviation FM or PM time domain pulse stretcher circuit, and timing diagrams constructed in accordance with the present invention.

FIG. 18 shows a block diagram of a preferred embodiment to implement an exemplary pulse stretcher for the reduced deviation time domain FM/PM discriminator circuit stage in FIG. 13 (i.e. FIG. 13-490) and FIG. 14 (i.e. FIG. 14-490) to demodulate the narrow frequency deviation FM (or PM) modulation signals as transmitted from the transmitter according to FIG. 1 or 2. The amplitude limited frequency deviation pulse width signal from the exclusive-or gate in FIG. 13 (i.e. FIG. 13-410), and FIG. 14 (i.e. FIG. 14-410) is expanded using a variable dual slope integration methodology to multiply the frequency deviation pulse width coming from the exclusive-or gate (i.e. FIG. 15-410). The reduced deviation time domain FM/PM discriminator circuit expands the frequency deviation pulse width by using a variable dual slope integrator with two fixed voltage reference sources. The exclusive-or gate (i.e. FIG. 18-410) is followed by the switch 1 (FIG. 18-500). The switch 1 (FIG. 18-500) supplies the reference voltage (FIG. 18-501) to the positive input of the variable dual slope integrator (i.e. FIG. 18-520) when a logical one or positive voltage output (b) from the exclusive-or gate (i.e. FIG. 18-410) is connected to the control input of switch 1 (FIG. 18-500). The integrator (i.e. FIG. 18-520) integrates or sums the reference voltage (FIG. 18-501) for the duration of the positive pulse or logical one pulse supplied by the exclusive-or gate (i.e. FIG. 18-410). The positive pulse or logical one pulse from the exclusive-or gate (i.e. FIG. 18-410) is also fed to the control circuitry (i.e. FIG. 18-540) following the exclusive-or gate (i.e. FIG. 18-410). The control circuitry (i.e. FIG. 18-540) is followed by the switch 2 (FIG. 18-510). The control circuitry (i.e. FIG. 18-540) upon the detecting logical one to logical zero transition on the frequency deviation pulse width signal from the exclusive-or gate (i.e. FIG. 18-410) sends a logical one or on voltage to the control input of switch 2 (FIG. 18-510). The switch 2 (FIG. 18-510) supplies the reference voltage divided by N (FIG. 18-510) to the negative input of the variable dual slope integrator (i.e. FIG. 18-520) while the control input of switch 2 (FIG. 18-510) remains at a logical one or on voltage. The variable slope integrator (i.e. FIG. 18-520) is followed by a comparator or level detector (i.e. FIG. 18-530). The comparator or level detector (i.e. FIG. 18-530) emits a positive voltage or a logical one when the input voltage from the variable slope integrator (i.e. FIG. 18-520) is greater than zero or the reference voltage, and zero voltage or logical zero when the input voltage from the variable dual slope integrator (i.e. FIG. 18-520) is less than zero or the reference voltage. The comparator or level detector (i.e. FIG. 18-530) is followed by the second input to the control circuitry (i.e. FIG. 18-540). The control circuitry (i.e. FIG. 18-540) upon the detecting logical one to logical zero transition from the comparator or level detector (i.e. FIG. 18-530) sends a logical zero or off voltage to the control input of switch 2 (FIG. 18-510). The switch 2 (FIG. 18-510) disconnects the reference voltage divided by N (FIG. 18-510) to the negative input of the variable dual slope integrator (i.e. FIG. 18-520) while the control input of switch 2 (FIG. 18-510) remains at a logical zero or off voltage. The comparator or level detector (i.e. FIG. 18-530) is followed by the AND gate (i.e. FIG. 18-420) controlling the clock pulses used to count the time duration or width of the time multiplied frequency deviation time width pulse.

The absolute values of the Vref reference voltage (FIG. 18-510) Vref/N, and reference voltage divided by N (FIG. 18-510) do not affect the accuracy of the frequency deviation measurement. The frequency deviation pulse width from the exclusive-or gate (i.e. FIG. 18-410) is multiplied by the ratio of Vref to Vref/N. The voltage ratio between Vref and Vref/N can be very accurately maintained by a simple resistive dividing network. The frequency deviation pulse width is multiplied by a factor of (N+1). Thus, the frequency deviation pulse width can be multiplied very exactly by using the exemplary pulse stretcher of a preferred embodiment of the patent.

Figure 19:
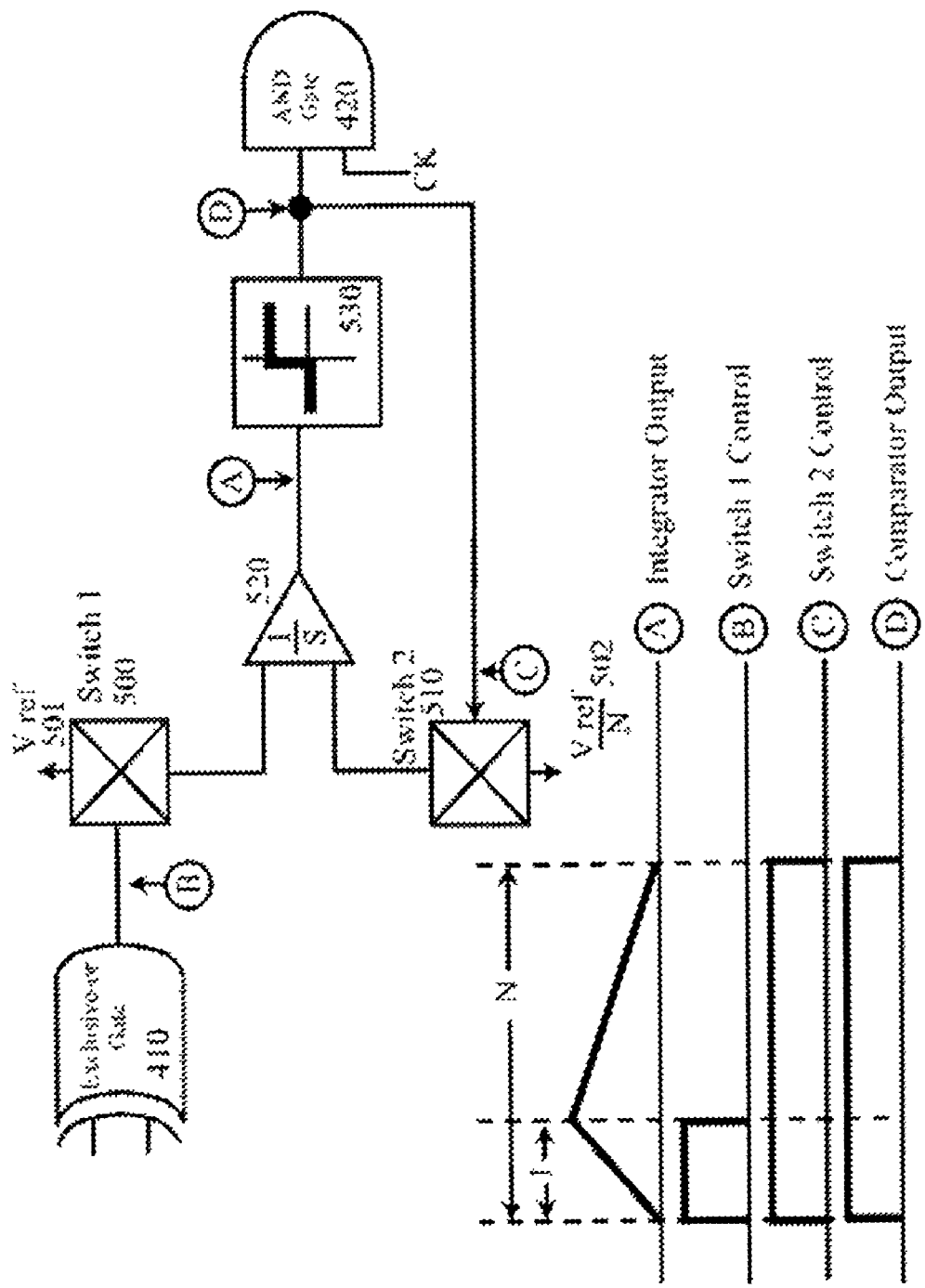
FIG. 19: Shows the block diagram of an alternative embodiment of a low frequency deviation FM or PM time domain pulse stretcher circuit, and timing diagrams constructed in accordance with the present invention.

FIG. 19 shows a block diagram of the alternative embodiment to implement an exemplary pulse stretcher for the reduced deviation time domain FM/PM discriminator circuit stage in FIG. 13 (i.e. FIG. 13-490) and FIG. 14 (i.e. FIG. 14-490) to demodulate the narrow frequency deviation FM (or PM) modulation signals as transmitted from the transmitter according to FIG. 1 or 2. Most elements in this embodiment are direct equivalents to those in the preferred embodiment of the reduced deviation time domain FM/PM discriminator circuit shown in FIG. 16, and are not repetitively described. The frequency deviation pulse width is multiplied by a factor of (N) instead of (N+1) as described in the preferred embodiment or the reduced deviation time domain FM/PM discriminator circuit (i.e. FIG. 16). The control circuitry (i.e. FIG. 16-540) is eliminated.

The variable slope integrator (i.e. FIG. 19-520) is followed by a comparator or level detector (i.e. FIG. 19-530). The comparator or level detector (i.e. FIG. 19-530) emits a positive voltage or a logical one when the input voltage from the variable slope integrator (i.e. FIG. 19-520) is greater than zero or the reference voltage, and zero voltage or logical zero when the input voltage from the variable dual slope integrator (i.e. FIG. 19-520) is less than zero or the reference voltage. The comparator or level detector (i.e. FIG. 19-530) is followed by the control input to switch 2 (FIG. 19-510). Thus, when comparator or level detector (i.e. FIG. 19-530) output is greater than zero or the reference voltages the switch 2 (FIG. 19-510) connects the reference voltage divided by N (FIG. 19-510) to the negative input of the variable dual slope integrator (i.e. FIG. 19-520). The switch 2 (FIG. 19-510) disconnects the reference voltage divided by N (FIG. 19-510) to the negative input of the variable dual slope integrator (i.e. FIG. 19-520) while the comparator or level detector (i.e. FIG. 19-530)) remains at a logical zero or off voltage. The comparator or level detector (i.e. FIG. 19-530) is followed by the AND gate (i.e. FIG. 19-420) controlling the clock pulses used to count the time duration or width of the time multiplied frequency deviation time width pulse.

The absolute values of the Vref reference voltage (FIG. 19-510) Vref/N, and reference voltage divided by N (FIG. 19-510) do not affect the accuracy of the frequency deviation measurement. The frequency deviation pulse width from the exclusive-or gate (i.e. FIG. 19-410) is multiplied by the ratio of Vref to Vref/N. The voltage ratio between Vref and Vref/N can be very accurately maintained by a simple resistive dividing network. The frequency deviation pulse width is multiplied by a factor of (N). The reduction in the time multiplication of the frequency deviation pulse width is caused by the switch 2 (FIG. 19-510) being turned on simultaneously width switch 1 (FIG. 19-500). Thus, the frequency deviation pulse width can be multiplied very exactly by using the exemplary pulse stretcher of the alternative embodiment of the patent.

Figure 20:
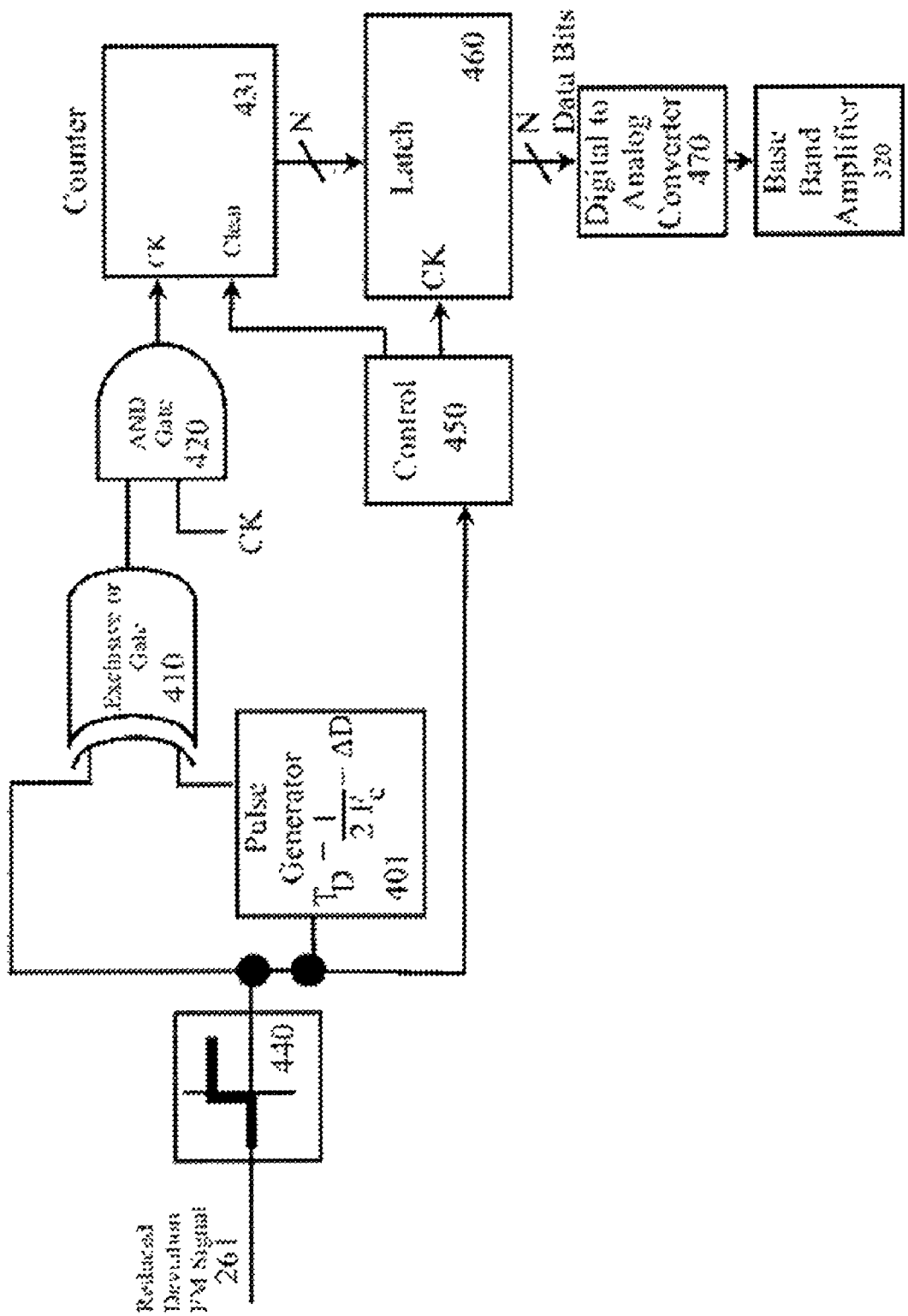
FIG. 20: Shows the block diagram of a preferred embodiment of a low frequency deviation FM or PM reduced deviation time domain FM/PM discriminator circuit using a time domain pulse stretcher, an offset time duration pulse generator, and a digital accumulator constructed in accordance with the present invention.

FIG. 20 shows a block diagram of an alternative embodiment of an exemplary low frequency deviation FM reduced deviation time domain FM/PM discriminator circuit in FIG. 8 to expand narrow, or reduced frequency deviation FM (or PM) modulation signals as transmitted from the transmitter according to FIG. 1 or 2. Most elements in this embodiment are direct equivalents to those in the preferred embodiment of the FM receiver shown in FIG. 8, and are not repetitively described.

The output of the exclusive-or gate (FIG. 20-410) measures the time difference (the frequency deviation) between the period of the Reduced Deviation FM Signal (FIG. 20-261), and the period of the pulse generator (FIG. 20-400) by emitting a pulse equal to the time difference between the period of the Reduced Deviation FM Signal (FIG. 20-261), and the period of the pulse generator (FIG. 20-400). The pulse generator (FIG. 8-400) has a fixed duration of one half the center frequency period of the Reduced Deviation FM Signal (FIG. 20-261) minus the time delay of the maximum frequency deviation (see FIG. 7). The reduction in the period of the pulse generator converts the reduced deviation time domain FM/PM discriminator circuit to two's complement arithmetic without having to determine if the frequency deviation of the FM signal is positive or negative frequency deviation.

Figure 21:
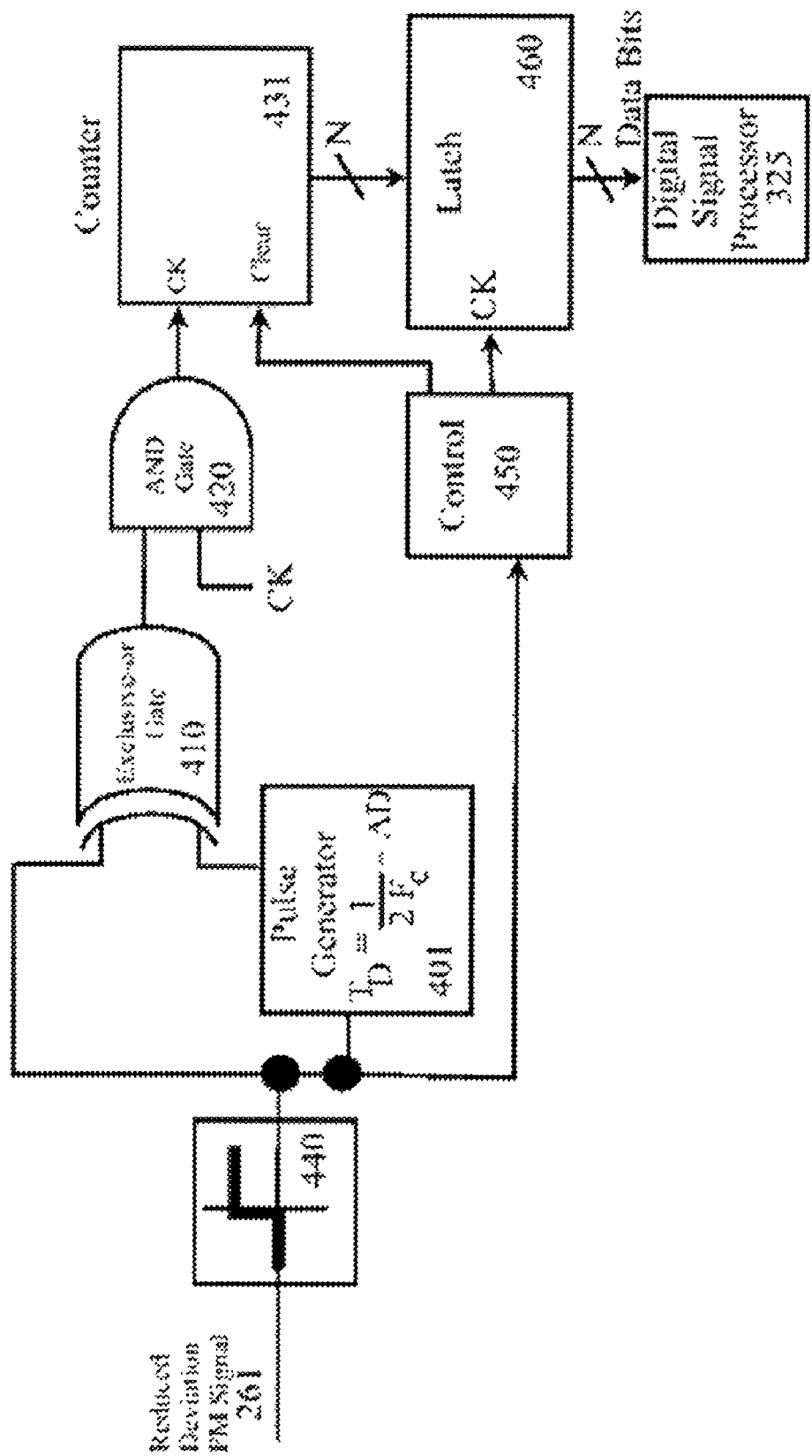
FIG. 21: Shows the block diagram of an alternative embodiment of a low frequency deviation FM or PM reduced deviation time domain FM/PM discriminator using a time domain pulse stretcher, an offset time duration pulse generator, a digital accumulator circuit, and using a DSP base band processor constructed in accordance with the present invention.

FIG. 21 shows a block diagram of an alternative embodiment of an exemplary low frequency deviation FM reduced deviation time domain FM/PM discriminator circuit in FIG. 8 to expand narrow, or reduced frequency deviation FM (or PM) modulation signals as transmitted from the transmitter according to FIG. 1 or 2. Most elements in this embodiment are direct equivalents to those in the exemplary embodiment of the FM receiver shown in FIG. 9, and are not repetitively described.

The output of the exclusive-or gate (FIG. 21-410) measures the time difference (the frequency deviation) between the period of the Reduced Deviation FM Signal (FIG. 21-261), and the period of the pulse generator (FIG. 21-400) by emitting a pulse equal to the time difference between the period of the Reduced Deviation FM Signal (FIG. 21-261), and the period of the pulse generator (FIG. 21-400). The pulse generator (FIG. 21-400) has a fixed duration of one half the center frequency period of the Reduced Deviation FM Signal (FIG. 21-261) minus the time delay of the maximum frequency deviation (see FIG. 7). The reduction in the period of the pulse generator converts the reduced deviation time domain FM/PM discriminator circuit to two's complement arithmetic without having to determine if the frequency deviation of the FM signal is positive or negative frequency deviation.

Figure 22:
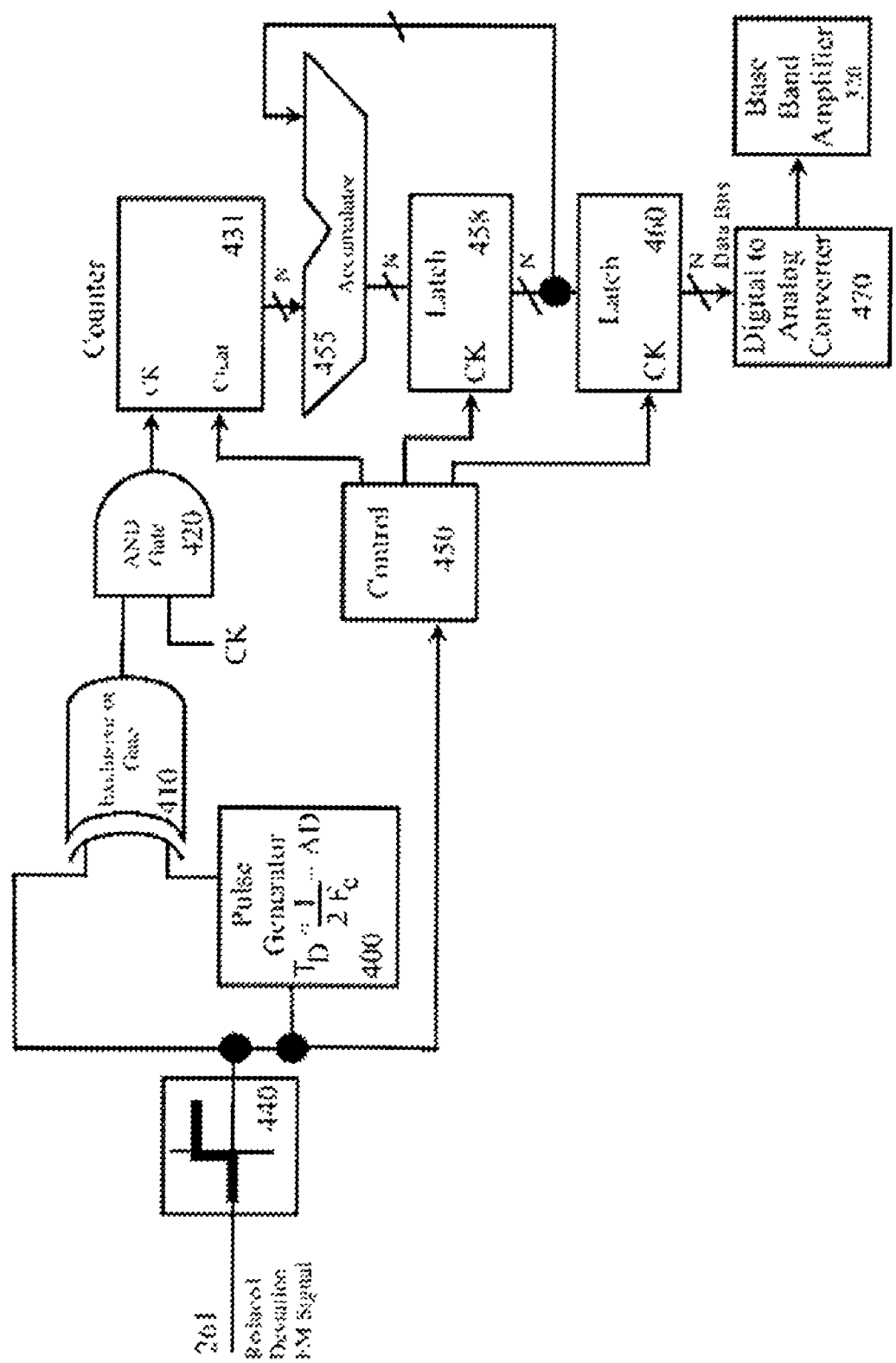
FIG. 22: Shows the block diagram of a preferred embodiment of a low frequency deviation FM or PM reduced deviation time domain FM/PM discriminator circuit using an offset time duration pulse generator, and a digital accumulator constructed in accordance with the present invention.

FIG. 22 shows a block diagram of an alternative embodiment of an exemplary low frequency deviation FM reduced deviation time domain FM/PM discriminator circuit in FIG. 8 to expand narrow, or reduced frequency deviation FM (or PM) modulation signals as transmitted from the transmitter according to FIG. 1 or 2. Most elements in this embodiment are direct equivalents to those in the exemplary embodiment of the FM receiver shown in FIG. 10, and are not repetitively described.

The output of the exclusive-or gate (FIG. 22-410) measures the time difference (the frequency deviation) between the period of the Reduced Deviation FM Signal (FIG. 22-261), and the period of the pulse generator (FIG. 22-400) by emitting a pulse equal to the time difference between the period of the Reduced Deviation FM Signal (FIG. 22-261), and the period of the pulse generator (FIG. 22-400). The pulse generator (FIG. 22-400) has a fixed duration of one half the center frequency period of the Reduced Deviation FM Signal (FIG. 22-261) minus the time delay of the maximum frequency deviation (see FIG. 7). The reduction in the period of the pulse generator converts the reduced deviation time domain FM/PM discriminator circuit to two's complement arithmetic without having to determine if the frequency deviation of the FM signal is positive or negative frequency deviation.

Figure 23:
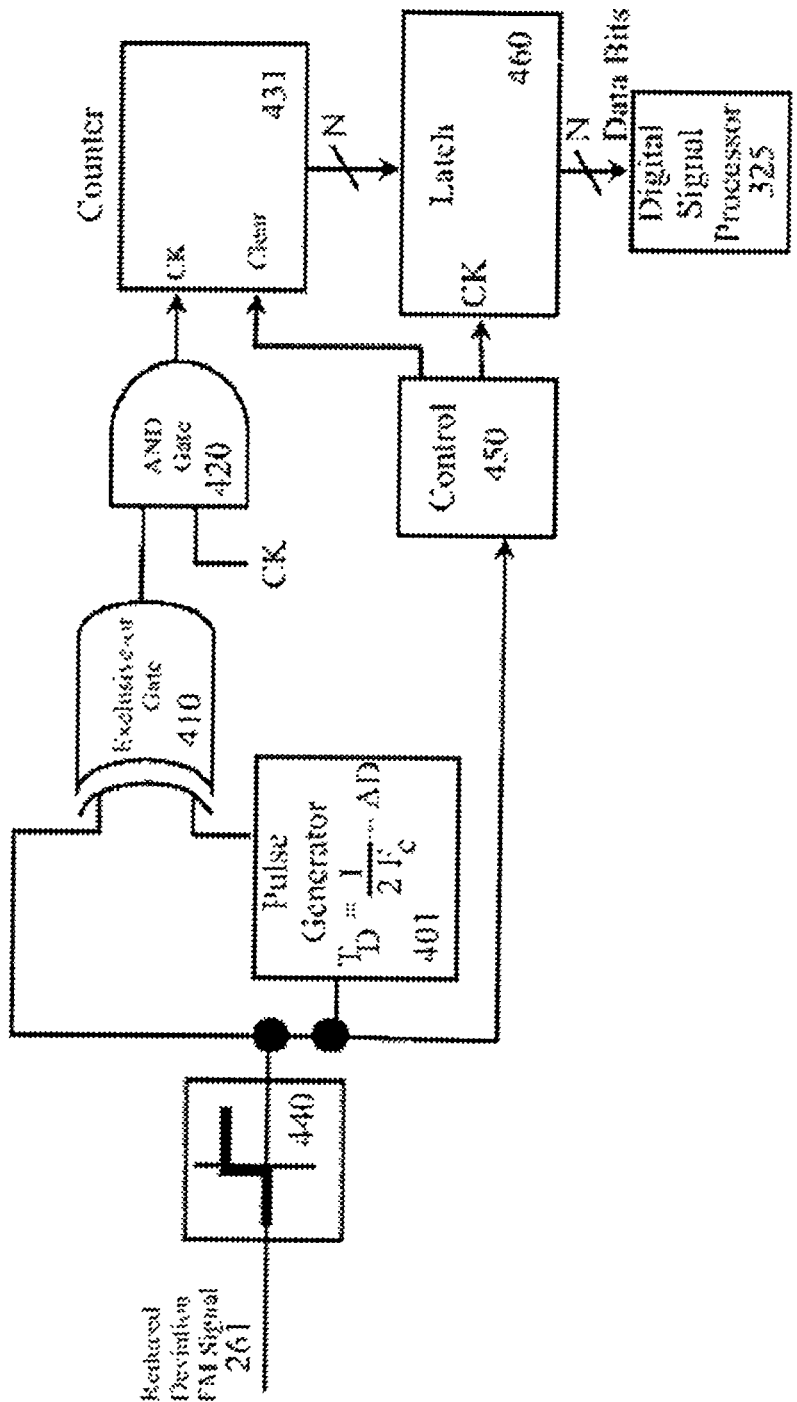
FIG. 23: Shows the block diagram of an alternative embodiment of a low frequency deviation FM or PM reduced deviation time domain FM/PM discriminator using an offset time duration pulse generator, a digital accumulator circuit and using a DSP base band processor constructed in accordance with the present invention.

FIG. 23 shows a block diagram of an alternative embodiment of an exemplary low frequency deviation FM reduced deviation time domain FM/PM discriminator circuit in FIG. 8 to expand narrow, or reduced frequency deviation FM (or PM) modulation signals as transmitted from the transmitter according to FIG. 1 or 2. Most elements in this embodiment are direct equivalents to those in the exemplary embodiment of the FM receiver shown in FIG. 11, and are not repetitively described.

The output of the exclusive-or gate (FIG. 23-410) measures the time difference (the frequency deviation) between the period of the Reduced Deviation FM Signal (FIG. 23-261), and the period of the pulse generator (FIG. 23-400) by emitting a pulse equal to the time difference between the period of the Reduced Deviation FM Signal (FIG. 23-261), and the period of the pulse generator (FIG. 23-400). The pulse generator (FIG. 23-400) has a fixed duration of one half the center frequency period of the Reduced Deviation FM Signal (FIG. 23-261) minus the time delay of the maximum frequency deviation (see FIG. 7). The reduction in the period of the pulse generator converts the reduced deviation time domain FM/PM discriminator circuit to two's complement arithmetic without having to determine if the frequency deviation of the FM signal is positive or negative frequency deviation.

Figure 24:
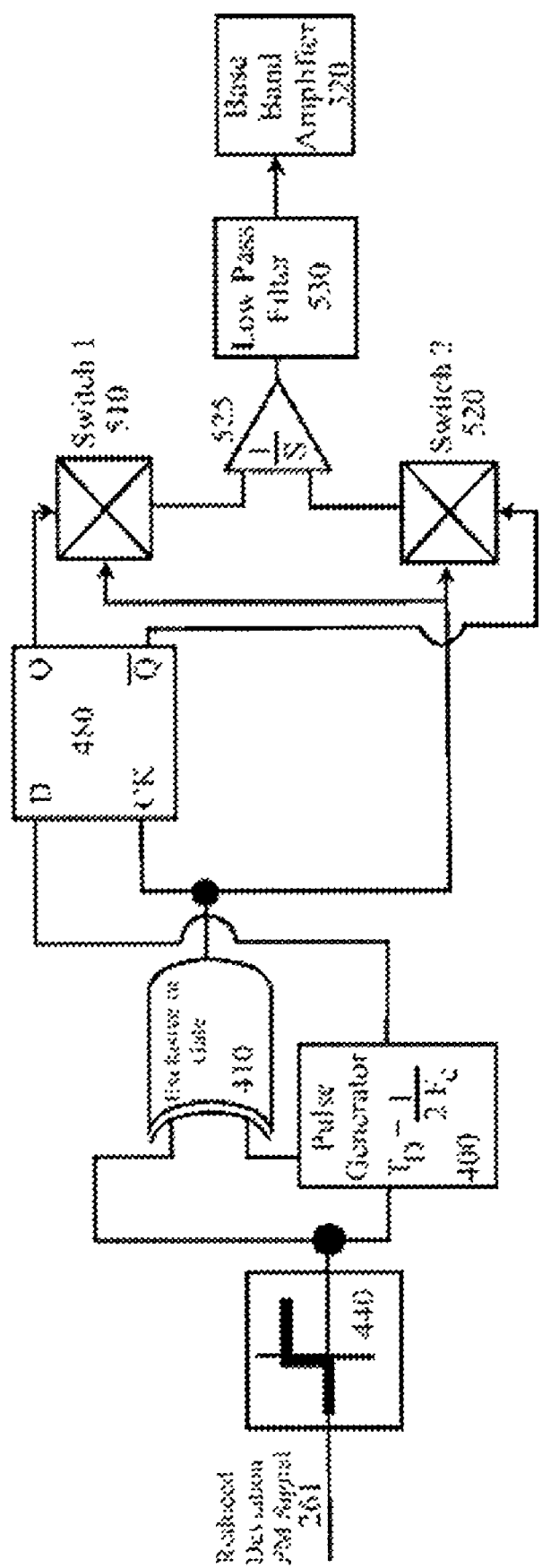
FIG. 24: Shows the block diagram of a preferred embodiment of a low frequency deviation FM or PM reduced deviation time domain FM/PM discriminator circuit with direct audio output constructed in accordance with the present invention.

FIG. 24 shows a block diagram of a preferred embodiment to implement an exemplary low frequency deviation FM reduced deviation time domain FM/PM discriminator circuit in FIG. 3 (i.e. FIG. 3-310), FIG. 4 (i.e. FIG. 4-310), FIG. 5 (i.e. FIG. 5-310, and FIG. 6 (i.e. FIG. 6-310) to expand narrow, or reduced frequency deviation FM (or PM) modulation signals as transmitted from the transmitter according to FIG. 1 or 2.

The narrow band, or reduced deviation FM signal from the Intermediate Frequency Amplifier and Limiter in FIG. 3 (i.e. FIG. 3-260), FIG. 4 (i.e. FIG. 4-260), FIG. 5 (i.e. FIG. 5-260), and FIG. 6 (i.e. FIG. 6-260) provides the Reduced Deviation FM Signal (FIG. 24-261). According to the circuit of the FM reduced deviation time domain FM/PM discriminator circuit in FIG. 24, the Reduced Deviation FM Signal (FIG. 24-261) is connected to the input of the analog to logic level converter (FIG. 24-440). The logic level converter (FIG. 24-440) detects the zero crossings of the Reduced Deviation FM Signal (FIG. 24-261). The logic level converter (FIG. 24-440) is followed by the pulse generator (FIG. 24-400) with a fixed duration of one half the center frequency period of the Reduced Deviation FM Signal (FIG. 24-261). An exclusive-or gate (FIG. 24-410) follows the pulse generator (FIG. 24-400) connecting one input of the exclusive-or gate (FIG. 8-410) to the output of the pulse generator (FIG. 24-400), and connecting the second input of the exclusive-or gate (FIG. 24-410) to the logic level converter (FIG. 24-440) output. The output of the exclusive-or gate (FIG. 24-410) measures the time difference between the period of the Reduced Deviation FM Signal (FIG. 24-261), and the period of the pulse generator (FIG. 24-400) by emitting a pulse equal to the time difference between the period of the Reduced Deviation FM Signal (FIG. 24-261), and the period of the pulse generator (FIG. 24-400). The circuitry must remember "the polarity" of the stretch frequency deviation or difference pulse to control which switch is turned on—switch 1 (FIG. 24-510) or switch 2 (FIG. 24-520). The D flip-flop (FIG. 24-480) clock input follows the pulse generator (FIG. 24-400), and the D flip-flop (FIG. 24-480) clock input follows the output of exclusive-or gate (FIG. 24-410). The D flip-flop (FIG. 24-480) is strobed by the signal from the exclusive-or gate (FIG. 24-410) remembering the polarity of the pulse generator (FIG. 24-400). The switch 1 (FIG. 24-510) is connected to the D flip-flop Q or true output (FIG. 12-480) and switch 2 (FIG. 24-520) is connected to the D flip-flop not-Q or false output.

The exclusive-or gate (FIG. 24-4 10) is followed by switch 1 (FIG. 24-510) or switch 2 (FIG. 24-520) connecting to switched inputs of switch 1 (FIG. 24-510) or switch 2 (FIG. 24-520) to the output of the exclusive-or gate (FIG. 24-410). The switch 1 (FIG. 24-510) or switch 2 (FIG. 24-520) outputs are connected to the inputs of the integrator (FIG. 24-530) and provides a gating or control function to provide a pulse, with the proper polarity, equal in duration to the time difference between the period of the Reduced Deviation FM Signal (FIG. 24-261), and the period of the pulse generator (FIG. 24-400). The duration of the pulse from switch 1 (FIG. 24-510) or switch 2 (FIG. 24-520) is the pulse width modulation value of the difference of the two frequencies (the Reduced Deviation FM Signal (FIG. 24-261) and the frequency of the pulse generator (FIG. 24-400)) by using the fact the IF frequency of a receiver is many times greater than the highest component of the base band signal, whether the base band signal is digital or analog. The integrator (FIG. 24-530) is followed by the Low Pass Filter (FIG. 24-530) that filters or converts the pulse width modulated base band signal from the integrator (FIG. 24-530) back to a base band analog signal. The Low Pass Filter (FIG. 24-530) is followed by the base band amplifier (FIG. 24-320) to amplify the base band analog signal to useful level to drive speakers, interface to computers, etc.

Figure 25:
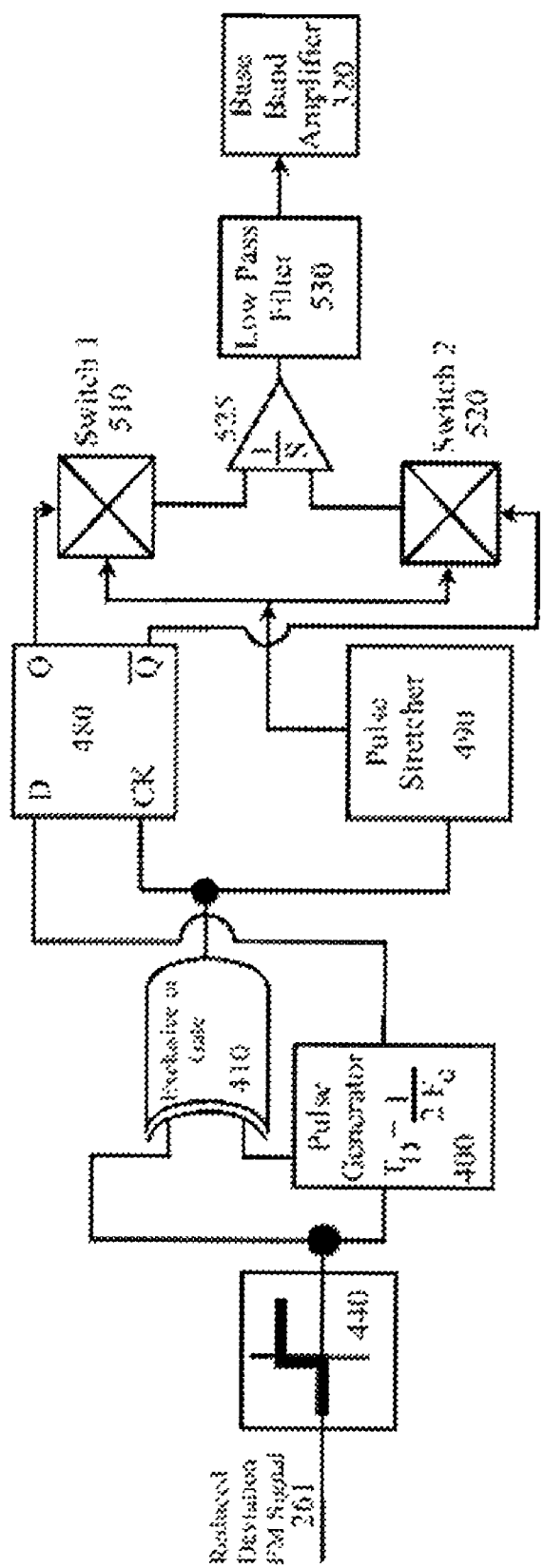
FIG. 25: Shows the block diagram of an alternative embodiment of a low frequency deviation FM or PM reduced deviation time domain FM/PM discriminator circuit using a time domain pulse stretcher with direct audio output constructed in accordance with the present invention.

FIG. 25 shows a block diagram of an alternative embodiment of an exemplary low frequency deviation FM reduced deviation time domain FM/PM discriminator circuit in FIG. 8 to expand narrow, or reduced frequency deviation FM (or PM) modulation signals as transmitted from the transmitter according to FIG. 1 or 2. Most elements in this embodiment are direct equivalents to those in the exemplary embodiment of the FM receiver shown in FIG. 24, and are not repetitively described.

The output of the exclusive-or gate (FIG. 25-410) measures the time difference (the frequency deviation) between the period of the Reduced Deviation FM Signal (FIG. 25-261), and the period of the pulse generator (FIG. 25-400) by emitting a pulse equal to the time difference between the period of the Reduced Deviation FM Signal (FIG. 25-261), and the period of the pulse generator (FIG. 25-400). To time expand the difference pulse, the pulse stretcher circuit (FIG. 25-490) follows the exclusive-or gate (FIG. 25-410). The pulse stretcher circuit multiplies the time duration of the difference pulse. This has the effect of multiplying the accuracy of the reduced deviation time domain FM/PM discriminator circuit. The pulse stretcher circuit (FIG. 25-490) is followed by the switch 1 (FIG. 25-510) or switch 2 (FIG. 25-520). The use of a pulse stretcher allows a greater amount of energy to be extracted from the pulse width modulation representation of the frequency deviation signal. This reduces the amplification requirements in the amplifications string (The Low Pass Filter (FIG. 25-530) and the base band amplifier (FIG. 25-320)) following the circuitry that generates the pulse width modulation pulse train— exclusive—or gate (FIG. 25-410).

Figure 26:
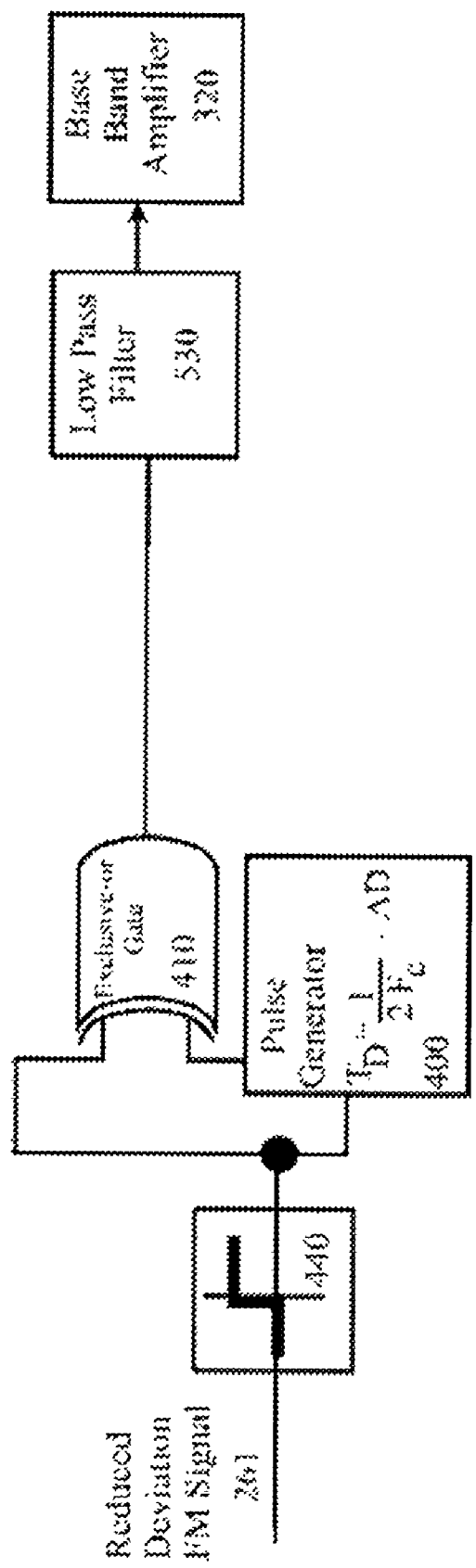
FIG. 26: Shows the block diagram of a preferred embodiment of a low frequency deviation FM or PM reduced deviation time domain FM/PM discriminator circuit an offset time duration pulse generator, with direct audio output constructed in accordance with the present invention.

FIG. 26 shows a block diagram of a preferred embodiment to implement an exemplary low frequency deviation FM reduced deviation time domain FM/PM discriminator circuit in FIG. 3 (i.e. FIG. 3-310), FIG. 4 (i.e. FIG. 4-310), FIG. 5 (i.e. FIG. 5-310, and FIG. 6 (i.e. FIG. 6-310) to expand narrow, or reduced frequency deviation FM (or PM) modulation signals as transmitted from the transmitter according to FIG. 1 or 2. The narrow band, or reduced deviation FM signal from the Intermediate Frequency Amplifier and Limiter in FIG. 3 (i.e. FIG. 3-260), FIG. 4 (i.e. FIG. 4-260), FIG. 5 (i.e. FIG. 5-260), and FIG. 6 (i.e. FIG. 6-260) provides the Reduced Deviation FM Signal (FIG. 26-261). According to the circuit of the FM reduced deviation time domain FM/PM discriminator circuit in FIG. 26, the Reduced Deviation FM Signal (FIG. 26-261) is connected to the input of the analog to logic level converter (FIG. 26-440). The logic level converter (FIG. 26-440) detects the zero crossings of the Reduced Deviation FM Signal (FIG. 26-261). The logic level converter (FIG. 26-440) is followed by the pulse generator (FIG. 24-400) with a fixed duration of one-half the center frequency period of the Reduced Deviation FM Signal (FIG. 26-261). An exclusive-or gate (FIG. 26-410) follows the pulse generator (FIG. 26-400) connecting one input of the exclusive-or gate (FIG. 66-410) to the output of the pulse generator (FIG. 26-400), and connecting the second input of the exclusive-or gate (FIG. 26-410) to the logic level converter (FIG. 26-440) output. The output of the exclusive-or gate (FIG. 26-410) measures the time difference between the period of the Reduced Deviation FM Signal (FIG. 26-261), and the period of the pulse generator (FIG. 26-400) by emitting a pulse equal to the time difference between the period of the Reduced Deviation FM Signal (FIG. 26-261), and the period of the pulse generator (FIG. 26-400). The pulse generator (FIG. 8-400) has a fixed duration of one half the center frequency period of the Reduced Deviation FM Signal (FIG. 26-261) minus the time delay of the maximum frequency deviation (see FIG. 7). The reduction in the period of the pulse generator converts the reduced deviation time domain FM/PM discriminator circuit to a linear pulse width modulation representation the frequency deviation of the FM signal.

The exclusive-or gate (FIG. 26-410) is followed by the Low Pass Filter (FIG. 26-530) that filters or converts the pulse width modulated base band signal from the integrator (FIG. 26-530) back to a base band analog signal. The Low Pass Filter (FIG. 26-530) is followed by the base band amplifier (FIG. 26-320) to amplify the base band analog signal to useful level to drive speakers, interface to computers, etc.

Figure 27:
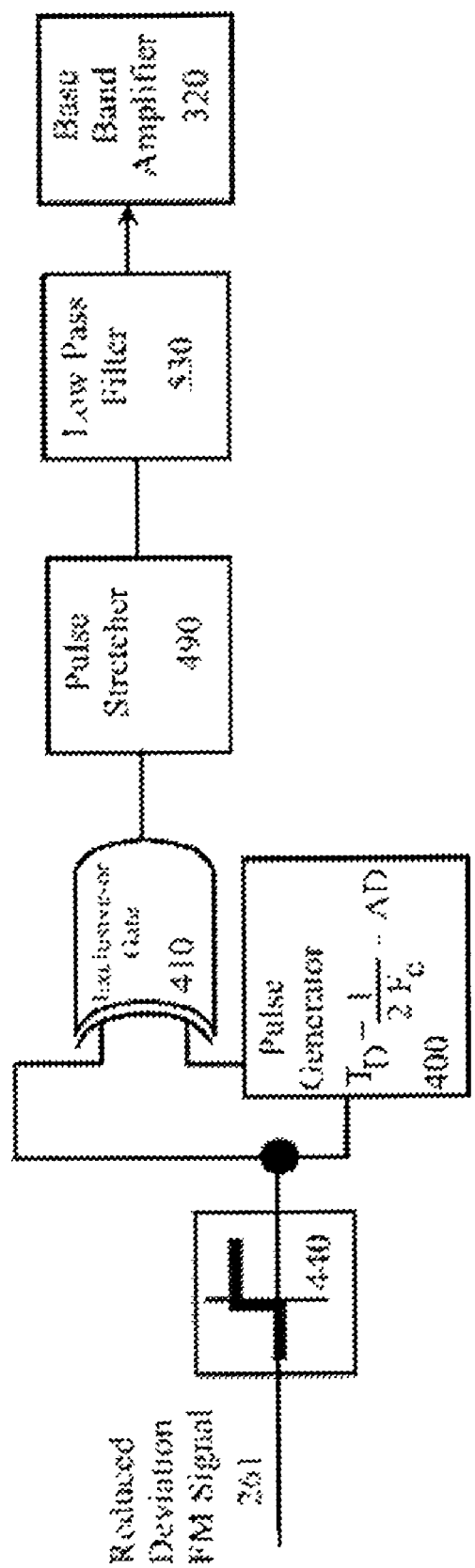
FIG. 27: Shows the block diagram of an alternative embodiment of a low frequency deviation FM or PM reduced deviation time domain FM/PM discriminator circuit using a time domain pulse stretcher, and an offset time duration pulse generator, with direct audio output constructed in accordance with the present invention.

FIG. 27 shows a block diagram of an alternative embodiment of an exemplary low frequency deviation FM reduced deviation time domain FM/PM discriminator circuit in FIG. 8 to expand narrow, or reduced frequency deviation FM (or PM) modulation signals as transmitted from the transmitter according to FIG. 1 or 2. Most elements in this embodiment are direct equivalents to those in the exemplary embodiment of the FM receiver shown in FIG. 24, and are not repetitively described.

The output of the exclusive-or gate (FIG. 27-410) measures the time difference (the frequency deviation) between the period of the Reduced Deviation FM Signal (FIG. 27-261), and the period of the pulse generator (FIG. 27-400) by emitting a pulse equal to the time difference between the period of the Reduced Deviation FM Signal (FIG. 27-261), and the offset period of the pulse generator (FIG. 25-400). To time expand the difference pulse, the pulse stretcher circuit (FIG. 27-490) follows the exclusive-or gate (FIG. 27-410). The pulse stretcher circuit multiplies the time duration of the difference pulse. This has the effect of multiplying the accuracy of the reduced deviation time domain FM/PM discriminator circuit. The pulse stretcher circuit (FIG. 27-490) is followed by the Low Pass Filter (FIG. 26-530). The use of a pulse stretcher allows a greater amount of energy to be extracted from the pulse width modulation representation of the frequency deviation signal. This reduces the amplification requirements in the amplifications string (The Low Pass Filter (FIG. 27-530) and the base band amplifier (FIG. 27-320)) following the circuitry that generates the pulse width modulation pulse train—exclusive—or gate (FIG. 27-410).

The invention is not limited to the example frequencies mentioned above.

The illustrated embodiments of the invention have the following feature(s):

Modulator-Transmitter:

Preferred embodiments of low frequency deviation FM transmitter according to the present invention incorporate the following features:

(1) The amplitude of the base band modulating signal is limited (i.e. designed) such that the modulated oscillator frequency deviation is limited, or controlled, thus the total frequency deviation of the transmitted frequency does not exceed a pre-selected bandwidth limit signal (i.e. 0.5 kHz for example). The soft limiting of the base band signal limits the frequency deviation of the signal without producing non-linearity's that limit the fidelity (i.e. BER (Bit Error Rate)) of the low frequency deviation FM system.

(2) The matched filters and the band pass filters in the transmitter are designed to limit the frequency spectrum of the transmitted signal and to reduce out of band signals.

Receiver-Demodulator:

In order to receive the narrow bandwidth FM signal from the transmitter, preferred embodiments of FM receivers are in accordance with the present invention, preferably incorporating the following characteristics:

(1) The reduced deviation time domain FM/PM discriminator circuit in the receiver is designed so that the processed IF (Intermediate Frequency) signal is presented to the FM discriminator, expanded and centered, at the original input IF (Intermediate Frequency) frequency.

(2) The reduced deviation time domain FM/PM discriminator circuit automatically compensates for mistuning and local oscillator frequency variation.

(3) The pulse generator performs first order filtering to filter noise in the IF string.

(4) A reduced deviation time domain FM/PM discriminator circuit is incorporated before a conventional FM discriminator, to increase frequency deviations of the FM signal, and resulting increase in base band signal quality being especially desirable when implemented in the ultra-high frequency (UHF), very high frequency (VHF), short wave (SW), medium wave (MW), or long wave (LW) bands.

Thus, in summary, according to the present invention, narrow band FM communications channels are implemented by transmitting a signal with a low frequency deviation (i.e. 0.5 kHz for example). Preferably after the FM signal is converted down to an IF signal, the signal with the small frequency deviation is expanded in-place in the receiver by TIME DOMAIN multiplying (N) the IF converted transmitted FM signal. As a consequence, the conventional bandwidth limitations of lower frequency deviation FM signals resulting in reduced SNR (Signal-to-Noise Ratio) and higher BER (Bit Error Rate) at the receiver are eliminated by the frequency deviation expansion in the receiver. The result is audio and digital base band signals with high SNR (Signal-to-Noise Ratio) and low BER (Bit Error Rate).

In accordance with the present invention, the number of channels of transmission with given frequency bandwidth can be increased, while the SNR (Signal-to-Noise Ratio) and BER (Bit Error Rate) can be simultaneously improved.

It will be appreciated by those skilled in the art that the embodiments described are merely illustrative, and that various modifications may be made which fall within the scope of the claims. The narrow bandwidth FM signal according to the invention can be implemented ranging from the long wave band (LW-band) to the microwave frequency bands, and the base band modulation can be, but not limited to, broadcasts in stereo, digital audio format, high definition television (digital video), fiber optic, and the like. It is therefore to be understood that, within the scope of the appended claims and their equivalents, the invention may be practiced otherwise than as specifically described.

What is claimed is:

1. A receiver for receiving a narrow frequency deviation frequency modulated or phase modulated base band signal comprising:

a mixer for mixing the received narrow frequency deviation signal to generate an intermediate frequency signal;

a band pass filter for filtering the intermediate frequency signal;

a narrow band discriminator circuit that performs a time domain expansion of the modulation deviation of the intermediate frequency signal and discriminates the base band signal comprising:

an analog to logic level converter for receiving a reduced deviation modulated signal;

a pulse generator that generates pulses with a fixed duration of one half the center frequency period of the intermediate frequency signal;

an exclusive-OR gate that receives an output of the logic level converter and the pulse generator;

an AND gate that receives an output of the exclusive-OR gate and a clock signal on each of its inputs;

a counter comprising an up/down input for indicating whether the counter counts up or down and is attached to the analog to logic level converter output, a clock input attached to the AND gate output, and a clear input attached to a control circuit, the counter further comprising N parallel outputs;

a latch comprising N parallel inputs and connected to the N parallel outputs of the counter and further comprising a clock input attached to an output of the control circuit and N parallel outputs; and wherein the control circuit clocks the data from the counter to the latch on the positive transition of the intermediate frequency signal, and sequentially clears the counter.

2. The device of claim 1 further comprising a digital signal processor for receiving the N parallel outputs of the latch.

3. The device of claim 1 further comprising a digital to analog converter for receiving the N parallel outputs of the latch and a base band amplifier for amplifying an output of the digital to analog converter.

4. The device of claim 1 further comprising an accumulator and an accumulator latch interposed between the counter and the latch for receiving the N parallel outputs of the counter, the N parallel outputs of the accumulator latch to generate N parallel inputs to the second accumulator input port and the latch receives the N parallel outputs of the accumulator latch.

5. A receiver for receiving a narrow frequency deviation frequency modulated or phase modulated base band signal comprising:
- a mixer for mixing the received narrow frequency deviation signal to generate an intermediate frequency signal;
- a band pass filter for filtering the intermediate frequency signal;
- a narrow band discriminator circuit that performs a time domain expansion of the modulation deviation of the intermediate frequency signal and discriminates the base band signal comprising:
   - an analog to logic level converter for receiving a reduced deviation modulated signal;
   - a pulse generator that generates pulses with a fixed duration of one half the center frequency period of the intermediate frequency signal;
   - an exclusive-OR gate that receives an output of the logic level converter and the pulse generator;
   - a pulse stretcher that receives an output of the exclusive-OR gate;
   - an AND gate that receives an output of the pulse stretcher and a clock signal on each of its inputs;
   - a flip-flop that receives the output of the pulse generator on an input and the output of the exclusive-OR gate on its clock input;
   - a counter comprising an up/down input for indicating whether the counter counts up or down and is attached to an output of the flip-flop, a clock input attached to the AND gate output, and a clear input attached to a control circuit, the counter further comprising N parallel outputs;
   - a latch comprising N parallel input and connected to the N parallel outputs of the counter and further comprising a clock input attached to an output of the control circuit and N parallel outputs; and
   - wherein the control circuit clocks the data from the counter to the latch on the positive transition of the intermediate frequency signal, and sequentially clears the counter.

6. The device of claim 5 further comprising a digital signal processor for receiving the N parallel outputs of the latch.

7. The device of claim 6 further comprising a digital to analog converter for receiving the N parallel outputs of the latch and a base band amplifier for amplifying an output of the digital to analog converter.

8. The device of claim 5 further comprising an accumulator and an accumulator latch interposed between the counter and the latch for receiving the N parallel outputs of the counter, the N parallel outputs of the accumulator latch to generate N parallel inputs to the second accumulator input port, and the latch receives the N parallel outputs of the accumulator latch.

9. The device of claim 5 wherein the pulse stretcher circuit comprises:
- a first switch that receives the input of the pulse stretcher and outputs a reference voltage to an input of a variable dual slope integrator when the input is a positive voltage;
- an analog to logic level converter receives the output of the integrator and generates the output of the pulse stretcher;
- a pulse stretcher control receives the input of the pulse stretcher and the output of the analog to logic converter and outputs a positive voltage to a second switch when it detects a logical one to logical zero transition on the input of the pulse stretcher and sends a signal to a control input of the second switch;
- the second switch outputs the reference voltage divided by N to a negative input of the variable dual slope integrator while the input of the second switch receives the signal from the accumulator control.

10. A receiver for receiving a narrow frequency deviation frequency modulated or phase modulated base band signal comprising:
- a mixer for mixing the received narrow frequency deviation signal to generate an intermediate frequency signal;
- a band pass filter for filtering the intermediate freciuency signal;
- a narrow band discriminator circuit that performs a time domain expansion of the modulation deviation of the intermediate frequency signal and discriminates the base band signal comprising:
   - an analog to logic level converter for receiving a reduced deviation modulated signal;
   - a pulse generator that generates pulses with a fixed duration of one half the center frequency period of the intermediate frequency signal;
   - an exclusive-OR gate that receives an output of the logic level converter and the pulse generator;
   - a pulse stretcher that receives an output of the exclusive-OR gate;
   - an AND gate that receives an output of the pulse stretcher and a clock signal on each of its inputs;
   - a flip-flop that receives the output of the pulse generator on an input and the output of the exclusive-OR gate on its clock input;
   - a counter comprising a clock input attached to the AND gate output and a clear input attached to a control circuit, the counter further comprising N parallel outputs;
   - an accumulator and an accumulator latch interposed between the counter and the latch for receiving the N parallel outputs of the counter, adding or subtracting the N parallel outputs of the counter based upon the output of the flip-flop received on the accumulator's plus/minus input to generate N parallel outputs to the accumulator latch;
   - a latch comprising N parallel inputs and connected to the N parallel outputs of the accumulator latch and further comprising a clock input attached to an output of the control circuit and N parallel outputs; and
   - wherein the control circuit clocks the data from the counter to the latch on the positive transition of the intermediate frequency signal, and sequentially clears the counter.

11. The device of claim 10 further comprising a digital signal processor for receiving the N parallel outputs of the latch.

12. The device of claim 10 further comprising a digital to analog converter for receiving the N parallel outputs of the latch and a base band amplifier for amplifying an output of the digital to analog converter.

13. The device of claim 10 wherein the pulse stretcher circuit comprises:
- a first switch that receives the input of the pulse stretcher and outputs a reference voltage to an input of a variable dual slope integrator when the input is a positive voltage;

an analog to logic level converter receives the output of the integrator and generates the output of the pulse stretcher;
a pulse stretcher control receives the input of the pulse stretcher and the output of the analog to logic converter and outputs a positive voltage to a second switch when it detects a logical one to logical zero transition on the input of the pulse stretcher and sends a signal to a control input of the second switch;
the second switch outputs the reference voltage divided by N to a negative input of the variable dual slope integrator while the input of the second switch receives the signal from the accumulator control.

14. A receiver for receiving a narrow frequency deviation frequency modulated or chase modulated base band signal comprising:
a mixer for mixing the received narrow frequency deviation signal to generate an intermediate frequency signal;
a band pass filter for filtering the intermediate frequency signal;
a narrow band discriminator circuit that performs a time domain expansion of the modulation deviation of the intermediate frequency signal and discriminates the base band signal comprising:
an analog to logic level converter for receiving a reduced deviation modulated signal;
a pulse generator that generates pulses with a fixed duration of one half the center frequency period of the intermediate frequency signal minus the time delay of the maximum frequency deviation;
an exclusive-OR gate that receives an output of the logic level converter and the pulse generator;
an AND gate that receives an output of the exclusive-OR gate and a clock signal on each of its inputs;
a counter comprising a clock input attached to the AND gate output and a clear input attached to a control circuit, the counter further comprising N parallel outputs;
a latch comprising N parallel input and connected to the N parallel outputs of the counter and further comprising a clock input attached to an output of the control circuit and N parallel outputs; and
wherein the control circuit clocks the data from the counter to the latch on the positive transition of the intermediate frequency signal.

15. The device of claim 14 further comprising a digital signal processor for receiving the N parallel outputs of the latch.

16. The device of claim 14 further comprising a digital to analog converter for receiving the N parallel outputs of the latch and a base band amplifier for amplifying an output of the digital to analog converter.

17. The device of claim 14 further comprising an accumulator and an accumulator latch interposed between the counter and the latch for receiving the N parallel outputs of the counter, adding the N parallel outputs of the counter to the N parallel outputs of the accumulator latch to generate N parallel outputs to the accumulator latch and the latch receives the N parallel outputs of the accumulator latch.

18. A receiver for receiving a narrow frequency deviation frequency modulated or phase modulated base band signal comprising:
a mixer for mixing the received narrow frequency deviation signal to generate an intermediate frequency signal;
a band pass filter for filtering the intermediate frequency signal a narrow band discriminator circuit that performs a time domain expansion of the modulation deviation of the intermediate frequency signal and discriminates the base band signal comprising:
an analog to logic level converter for receiving a reduced deviation modulated signal;
a pulse generator that generates pulses with a fixed duration of one half the center frequency period of the intermediate frequency signal;
an exclusive-OR gate that receives an output of the logic level converter and the pulse generator;
a flip-flop having an input connected to the pulse generator, a clock input connected to the output of the exclusive-OR gate, an output and a NOT output;
a first switch for receiving the output of the exclusive-OR gate and the output of the flip-flop and passing the flip-flop output when the output of the exclusive-OR gate is positive;
a second switch for receiving the output of the exclusive-OR gate and the NOT output of the flip-flop and passing the flip-flop output when the output of the exclusive-OR gate is negative;
an integrator having a positive input connected to the first switch and a negative input connected to the second switch; and
a low pass filter connected to the output of the integrator.

19. The device of claim 18 further comprising a pulse stretcher interposed between the connections of the exclusive-OR gate and the first and second switches.

20. A receiver for receiving a narrow frequency deviation frequency modulated or phase modulated base band signal comprising:
a mixer for mixing the received narrow frequency deviation signal to generate an intermediate frequency signal;
a band pass filter for filtering the intermediate frequency signal;
a narrow band discriminator circuit that performs a time domain expansion of the modulation deviation of the intermediate frequency signal and discriminates the base band signal comprising:
an analog to logic level converter for receiving a reduced deviation modulated signal;
a pulse generator that generates pulses with a fixed duration of one half the center frequency period of the intermediate frequency signal minus the time delay of the maximum frequency deviation;
an exclusive-OR gate having an input attached to the output of the analog to logic level converter and an input attached to the output of the pulse generator; and
a low pass filter attached to the output of the exclusive-OR gate.

21. The device of claim 20 further comprising a pulse stretcher interposed between the exclusive-OR gate and the low pass filter.

* * * * *